(12) United States Patent
Clifton et al.

(10) Patent No.: US 11,271,370 B2
(45) Date of Patent: Mar. 8, 2022

(54) TENSILE STRAINED SEMICONDUCTOR PHOTON EMISSION AND DETECTION DEVICES AND INTEGRATED PHOTONICS SYSTEM

(71) Applicant: Acorn Semi, LLC, Palo Alto, CA (US)

(72) Inventors: Paul A. Clifton, Redwood City, CA (US); Andreas Goebel, Mountain View, CA (US); R. Stockton Gaines, Pacific Palisades, CA (US)

(73) Assignee: Acorn Semi, LLC, Palo Alto, CA (US)

( * ) Notice: Subject to any disclaimer, the term of this patent is extended or adjusted under 35 U.S.C. 154(b) by 51 days.

(21) Appl. No.: 16/946,777

(22) Filed: Jul. 6, 2020

(65) Prior Publication Data
US 2020/0335945 A1    Oct. 22, 2020

Related U.S. Application Data

(63) Continuation of application No. 16/213,876, filed on Dec. 7, 2018, now Pat. No. 10,727,647, which is a
(Continued)

(51) Int. Cl.
*H01S 5/00*       (2006.01)
*H01S 5/32*       (2006.01)
(Continued)

(52) U.S. Cl.
CPC ............ *H01S 5/3201* (2013.01); *H01S 5/125* (2013.01); *H01S 5/187* (2013.01); *H01S 5/2203* (2013.01);
(Continued)

(58) Field of Classification Search
CPC ........ H01S 5/3201; H01S 5/125; H01S 5/187; H01S 5/2203; H01S 5/3223; H01S 5/3224; H01S 5/3427; H01S 5/227
See application file for complete search history.

(56) References Cited

U.S. PATENT DOCUMENTS 6,724,088 B1   4/2004   Jammy et al.
7,596,158 B2   9/2009   Liu et al.
(Continued)

FOREIGN PATENT DOCUMENTS

DE    102008061152 A1    6/2010
WO    2011/044226 A2     4/2011

OTHER PUBLICATIONS

Boucaud et al., "Photoluminescence of a tensilely strained silicon quantum well on a relaxed sige buffer layer," CNRS Applied Physics Letters, Jul. 5, 2004, pp. 46-48, vol. 85, No. 1.
(Continued)

*Primary Examiner* — Kinam Park
(74) *Attorney, Agent, or Firm* — Ascenda Law Group, PC

(57) ABSTRACT

Tensile strained germanium is provided that can be sufficiently strained to provide a nearly direct band gap material or a direct band gap material. Compressively stressed or tensile stressed stressor materials in contact with germanium regions induce uniaxial or biaxial tensile strain in the germanium regions. Stressor materials may include silicon nitride or silicon germanium. The resulting strained germanium structure can be used to emit or detect photons including, for example, generating photons within a resonant cavity to provide a laser.

21 Claims, 23 Drawing Sheets

Related U.S. Application Data continuation of application No. 15/800,450, filed on Nov. 1, 2017, now Pat. No. 10,193,307, which is a continuation of application No. 15/000,975, filed on Apr. 4, 2016, now Pat. No. 10,008,827, which is a continuation of application No. 14/698,759, filed on Apr. 28, 2015, now Pat. No. 9,270,083, which is a continuation of application No. 14/256,758, filed on Apr. 18, 2014, now Pat. No. 9,036,672, which is a continuation of application No. 13/209,186, filed on Aug. 12, 2011, now Pat. No. 8,731,017.

(51) Int. Cl.
| | |
|---|---|
| H01S 5/22 | (2006.01) |
| H01S 5/125 | (2006.01) |
| H01S 5/187 | (2006.01) |
| H01S 5/34 | (2006.01) |
| H01S 5/227 | (2006.01) |

(52) U.S. Cl.
CPC .......... *H01S 5/3223* (2013.01); *H01S 5/3224* (2013.01); *H01S 5/3427* (2013.01); *H01S 5/227* (2013.01)

(56) References Cited

U.S. PATENT DOCUMENTS

| | | | |
|---|---|---|---|
| 8,731,017 | B2 | 5/2014 | Clifton et al. |
| 9,036,672 | B2 | 5/2015 | Clifton et al. |
| 9,270,083 | B2 | 2/2016 | Clifton et al. |
| 10,193,307 | B2 * | 1/2019 | Clifton ................ H01S 5/3224 |
| 2007/0029553 | A1 | 2/2007 | Ozturk et al. |
| 2007/0105251 | A1 | 5/2007 | Liu et al. |
| 2008/0237636 | A1 * | 10/2008 | Jin ..................... H01L 29/7843 257/190 |
| 2008/0272391 | A1 | 11/2008 | Kapur et al. |
| 2009/0065853 | A1 * | 3/2009 | Hanafi ................ H01L 29/7843 257/327 |
| 2010/0207254 | A1 * | 8/2010 | Jain ..................... H01L 31/105 257/629 |
| 2010/0290217 | A1 * | 11/2010 | Anantram ............... H01S 5/341 362/159 |
| 2011/0068407 | A1 | 3/2011 | Yeh et al. |
| 2011/0101419 | A1 * | 5/2011 | Hata ................. H01L 21/02502 257/190 |
| 2012/0199812 | A1 * | 8/2012 | Baykan ............ H01L 31/03529 257/13 |
| 2015/0014632 | A1 * | 1/2015 | Kim ................... H01L 29/0817 257/24 |
| 2018/0375290 | A1 * | 12/2018 | Miyasaka ........... H01S 5/34313 |

OTHER PUBLICATIONS

Cannon et al., "Tensile strained epitaxial Ge films on Si(100) substrates with potential application in L-band telecoms," Applied Physics Letters, Feb. 9, 2004, pp. 906-908, vol. 84, No. 6.
Chaudhari et al., "Highly Compact Optical Waveguides With A Novel Pedestal Geometry," IEEE Photonic Technology Letts, 1995, pp. 526-528, vol. 7.
S-L Cheng et al., "Room Temperature 1 6 urn Electroluminescence from Ge Light Emitting Diode on Si substrate," Optics Express, Jun. 8, 2009, pp. 10019-10024, vol. 17, No. 12.
T-H. Cheng et al., "Competitiveness Between Direct and Indirect Radiative Transitions of Ge," Applied Physics Letters, 2010, pp. 091105-1-091105-3, vol. 96.
T-H Cheng, et al., "Strain-Enhanced Photoluminescence From Ge Direct Transition" Applied Physics Letters, 2010, pp. 211108-1-211108-3, vol. 96.
Cheng T-H, et al. "Electrically Pumped Ge Laser at Room Temperature," Proc. of the IEEE International Electron Devices Meeting, Dec. 2007, pp. 659-662.
Chen, et al. "Quantum-Confined Direct Band Transitions in Tensile Strained Ge—SiGe Quantum Wells on Silicon Substrates," Nanotechnology, Feb. 24, 2010, p. 115207, vol. 21.
Chrastina, et al., "Ge—SiGe Multiple Quantum Wells For Optical Applications," IEEE Int. Conf. on Group IV Photonics, Sep. 2008, pp. 194-196.
www.compound.semiconducter.net "LETI Shows Off New CMOS Laser," May 2010, p. 12.
El Kurd I, et al., "Control of Direct Band Gap Emission Of Bulk Germanium By Mechanical Tensile Strain," Applied Physics Letters 2010, pp. 041909-1-041909-3, vol. 96.
El Kurdi et al., "GeOI Photonic Crystal Cavities Probed by Room-Temperature Photoluminescence," IEEE Int. Con. on Group IV Photonics, Sep. 2008, pp. 19-20.
El Kurdi, et al., "Band Structure And Optical Gain Of Tensile-Strained Germanium Based on a 30band k • p Formalism," J. Appl. Phys.,Jan. 2010, pp. 013710-1-013710-7, vol. 107.
El Kurdi et al., "Two-dimensional Photonic Crystals With Pure Ge-on-Insulator," Optics Communications, 2008, pp. 846-850, vol. 281, No. 4.
Hu et al., "Electroluminescence From Ge on Si Substrate at Room Temperature," Applied Physics Letters, Aug. 2009, pp. 092102-1-092102-3, vol. 95.
Huo et al, "Strong Enhancement of Direct Transition Photoluminescence with Highly Tensile Strained Ge," Applied Physics Letters, 2011, pp. 011111-1-011111-3, vol. 98.
Cheng Li, et al., "Enhanced Photoluminescence of Strained Ge with a Delta-Doping SiGe Layer on Silicon and Silicon-On-Insulator," Applied Physics Letters, Dec. 2009, pp. 251102, vol. 95.
Liang et al, "Recent Progress in Lasers on Silicon," Nature Photonics, Jul. 2010, pp. 511-517, vol. 4.
Liao et al, "Electroluminescence From the Ge Quantum Dot MOS Tunneling Diodes," Electron Device Letts., Apr. 2006, pp. 252-254, vol. 27.
Lim, et al., "Enhanced Direct Bandgap Emission from Germanium-Based Ring Resonators," IEEE Int. Conf. on Group IV Photonics, Sep. 2008, pp. 356-358.
Lim et al., "Enhanced Direct Bandgap Emission In Germanium by Micromechanical Strain Engineering," Optics Express, Aug. 31, 2009, pp. 16358-16365, vol. 17, No. 18.
Liu et al., "Ge-Based Active Devices for Si Photonics," Proc. Group IV Photonics Conf., Sep. 2007, pp. 279-281.
Liu et al., "Tensile-Strained, n-type Ge as a Gain Medium For Monolithic Laser Integration on Si," Optics Express, Sep. 3, 2007, pp. 11272-11277, vol. 15, No. 18.
Liu, et al., "Ge on Si Laser Operating at Room Temperature," Optics Letters, Mar. 2010, pp. 679-681, vol. 35, No. 5.
Menendez et al., "Type-I Ge/Ge1-x-ySixSny Strained-Layer Heterostructures with a Direct Ge bandgap," Applied Physics Letters, Aug. 16, 2004, pp. 1175-1177, vol. 85.
Novikov et al., "Intense Photoluminescence from GeSi Self-Assembled Islands Embedded in a Tensile-Strained Si Layer," Semicond. Sci. Tech., 2007, pp. S29-S32, vol. 22.
Reshotko, et al., "Waveguide Coupled Ge-on-oxide Photodetectors for Integrated Optical Links," Proc. Group IV Photonics Conf., Sep. 2008, pp. 182-184.
Sun et al, "Band-Engineered Ge for Si-based Light Emitter" electrochem.org, 2008, Abstract, Electro Chemical Society.
Sun et al., "Direct Gap Photoluminescence of n-type Tensile-Strained Ge-on-Si," Applied Physics Letters, Jul. 2009, p. 011911, vol. 95.
Sun et al., "Room-Temperature Direct Bandgap Electroluminesence from Ge-on-Si Light-Emitting Diodes," Optics Letters, Apr. 2009, pp. 1198-1200, vol. 34.
Yu et al., "Effect of Uniaxial-Strain on Ge p-i-n Photodiodes Integrated Letters, Oct. 2009, pp. 161106, vol. 95.
Zhang et al., "Prediction that Uniaxial Tension Along 111 Produces Germanium," Phys. Rev. Lett., Apr. 17, 2009, p. 156401, vol. 102.
German Patent Office official communication dated Nov. 11, 2013 for German Patent Application No. 10 2012 315 309.0, 11 pgs. including English translation.

* cited by examiner

TENSILE STRAINED SEMICONDUCTOR PHOTON EMISSION AND DETECTION DEVICES AND INTEGRATED PHOTONICS SYSTEM

RELATED APPLICATIONS

This is a CONTINUATION of U.S. application Ser. No. 16/213,876, filed Dec. 7, 2018, which is a CONTINUATION of U.S. application Ser. No. 15/800,450, filed Nov. 1, 2017, now U.S. Pat. No. 10,193,307, which is a CONTINUATION of U.S. application Ser. No. 15/000,975, filed Jan. 19, 2016, now U.S. Pat. No. 10,008,827, which is a CONTINUATION of U.S. application Ser. No. 14/698,759, filed Apr. 28, 2015, now U.S. Pat. No. 9,270,083, which is a CONTINUATION of U.S. application Ser. No. 14/256,758, filed Apr. 18, 2014, now U.S. Pat. No. 9,036,672, which is a CONTINUATION of U.S. application Ser. No. 13/209,186, filed Aug. 12, 2011, now U.S. Pat. No. 8,731,017, each of which are hereby incorporated herein by reference.

FIELD OF THE INVENTION

The present invention relates generally to optical systems that include semiconductor light emitting devices or semiconductor light detectors. More specifically, the present invention relates to semiconductor light emitting or detecting devices that incorporate a strained group IV semiconductor material in an active reg 10n.

DESCRIPTION OF THE RELATED ART

There is continuing interest in using group IV semiconductor materials in photonics systems because of the ease of manufacturing such systems and the ease of integrating these group IV photonics with circuitry. Silicon, germanium and their alloy are the group IV semiconductors most frequently considered for photonics systems. For example, light emission from silicon or within silicon is of great interest. Silicon and germanium exhibit an indirect bandgap, as does their alloy over its full range of compositions. Conventionally these are not efficient materials for light emission because the conduction band involved in a direct optical transition is not occupied, so that there are essentially no electron-hole pairs that can recombine and generate a photon directly, without the additional contribution of another entity such as a lattice vibration or impurity.

A cost-effective way to integrate photonic functions with silicon-based ULSI chips such as multi-core processors or leading-edge memory would open the door to far-reaching architecture changes and performance improvement for modern computing. One suggested application of these photonic functions is to replace some of the intra-chip copper interconnects within modern ULSI chips, for example for routing data from one CPU core to another, where both cores are on the same physical silicon chip. At the same time, a practical group IV photonics solution could provide extreme cost reduction benefits in manufacturing more conventional photonic systems.

The principal ways to incorporate photonics with existing CMOS process flows include the following topologically distinct options: i) manufacture the optical components before the transistor; ii) manufacture the optical components after the transistor integration, i.e., either before, within or directly after the metal interconnect layers; or iii) manufacture an optically-enabled layer using group IV semiconductors that can be attached to ULSI chips by one of various mechanisms. The attachment mechanisms may include wafer bonding, co-packaging of several dies next to each other where they are wire-bonded or connected by features in the package, and stacking dies and connecting them, for example using through-silicon vias (TSVs). Using a separate optical layer allows for decoupling of the manufacturing challenges and critical integration steps encountered in transistor and ULSI electrical interconnect manufacturing from those required for the optical layer.

On the other hand, it is advantageous to emit light on-chip to avoid coupling and alignment issues that otherwise have to be solved. On-chip light emission is very challenging when using group IV semiconductors as the optically active, light-emitting material in the optical layer. The literature reports light emission in silicon using the Raman effect to convert externally supplied light of a certain wavelength to a different wavelength. Light emission using the Raman effect is a low efficiency process.

An optical system or an optical layer typically has several functional components. An optical layer usually includes a light source, perhaps with an integrated bandwidth filter to select from a broad spectrum the wavelength, i.e., the "color" of light being utilized. The light source can be a laser that emits coherent light or a light emitting diode. The light source can be either directly modulated, e.g., by modulating the current through the light source, akin to switching a light bulb on and off (high and low), or by modulating information onto the "light beam" through a separate component external to the light source, i.e., using a modulator. External modulators are known in the art, including ring modulators and Mach-Zehnder modulators.

An optical layer usually includes at least one waveguide that can route light in the form of a continuous wave or in modulated form, i.e., as a signal, from one point to another. Waveguide performance considerations include attenuation, the degree to which light is lost per unit length, e.g., due to light scattering or due to light absorption into the waveguide or adjacent material. Another important performance metric is the waveguide's ability to turn guided light into another direction with a small turning radius without significant loss of light. Tight turning radii can be achieved, e.g., by using high confinement waveguides where the refractive index of the guide is considerably higher than in the surrounding volume so that the light wave intensity is mostly carried inside the waveguide volume. The interplay between turning radius and leakage of the evanescent tail of light intensity outside the waveguide is an important parameter for the design of ring modulators or routing switches. Tight turns can also be facilitated by means of mirrors for which the angle between the direction of the incoming light and the normal to the mirror surface is substantially the same as between the direction of the outgoing light and the mirror normal direction. A further aspect is the degree to which the waveguide maintains a given light polarization.

An optical layer usually includes a routing or a switching element that receives light from an incoming waveguide and selects from a number of outgoing waveguides one or several that will carry the outgoing light. A mirror can be thought of as a routing element with one incoming and one outgoing waveguide. Other examples for these elements include arrayed waveguide couplers, multi-mode interference couplers and ring-couplers.

An optical layer usually includes a detector that measures the intensity of the incoming light with accuracy and at high speeds. Often detectors are reverse biased photodiodes. The responsivity and external and internal quantum efficiency of photodiodes should preferably be high for the wavelength of light to be detected. Often their speeds are limited by the RC value, the product between the detector capacitance (junction capacitance and stray capacitance) and the resistance value and capacitance of the conductors leading to the reverse biased junction. The RC value measures the time within which charge carriers generated at the detector junction can deliver a detectable current at the electrical detector terminal, i.e., the external speed of the detector.

An optical layer usually includes drive electronics either on the same optical layer or in a separate layer, e.g., in the CMOS chip for which the photonics layer provides part of the interconnect.

Future data transmission bandwidth requirements, e.g., between racks in server farms, from one board to another board, from a processor to electrical circuit board or to memory will continue to grow into the several Tbps data bandwidth range. Current optical components for light sources, modulators or even detectors cannot operate at these frequencies. More specifically, the ability to put information onto a carrier beam either by direct modulation of light sources or by means of a modulator currently do not exceed frequencies of several tens of Gbps.

Therefore an approach in which multiple light beams (equivalent to a number of bus lines) are used to transmit the data in parallel is necessary to get to Tbps system bandwidths. If the light beams carrying the information have different wavelengths multiple carrier signals can be transmitted through a single waveguide and couplers. Such a scheme called wavelength division multiplexing (WDM) is well-known in telecommunications. A multitude of point-to-point connections using the same or similar wavelengths can be envisioned and waveguides can even cross each other since the light beams do not interact with each other.

It is desirable to build such a WDM system or a network of point-to-point connections within a single optical layer to reduce cost.

Several methods to generate light within an optical layer are known. One method is the hybrid laser, which achieves light amplification by letting some light energy being guided in a silicon waveguide reach or extend into an optically active InP-based multiple quantum well material in which the light amplification is achieved by electrically pumping the optically active transitions in the direct bandgap InP-based material.

Another prior art method utilizes a reduction of the direct bandgap of germanium which is achieved through the biaxial straining of germanium. The strain occurs because of a mismatch of thermal expansion coefficients between germanium and the substrate on which the germanium is deposited in a process step at elevated temperature. Upon lowering the temperature the germanium becomes biaxially tensile strained to a small degree, typically less than 0.3%. In this case, the strain is not strong enough to fully turn germanium into a direct bandgap material and the energetically smallest transition from the conduction band to the valence band of germanium continues to be a transition that is not optically allowed (i.e. it is indirect and involves another quasi-particle such as a phonon or lattice vibration.) The predominance of the indirect band transition is countered by doping an active region of the light emitting device very strongly n type, so that the states in the lowest lying conduction band valley are populated. Under a high level of electrical injection of carriers into the n+ region, carriers (electrons) spill from the conduction band valley for which an optical transition is forbidden (indirect gap) into the energetically slightly higher conduction band valley for which the optical transition is allowed (direct gap.) The forbidden transition becomes saturated, and carriers spill into the more effective direct bandgap transition states.

Where light is generated on-chip, i.e., within the optical layer, optical layers can use homogenous materials or a heterogeneous material system. In a homogeneous material system, light is emitted and detected in a material that is chemically substantially the same for all components of the system, such as the light source, waveguide, modulator, switch or detector. In a heterogeneous material system the light is emitted in a material that is chemically different from the waveguide or the detector material.

SUMMARY OF THE PREFERRED EMBODIMENTS

An aspect of the present invention provides an optical device having a germanium region in contact with a plurality of stressor regions. The plurality of stressor regions induces tensile strain within the germanium region. The tensile strain in at least a portion of the germanium region is sufficient to cause a portion of the germanium region to have a direct band gap. A junction is positioned in or adjacent the portion of the germanium region, the junction having a first side with a first majority carrier type and a second side with a second majority carrier type. First and second contacts are respectively coupled to the first side of the junction and the second side of the junction.

According to another aspect of the present invention, an optical device comprises first and second germanium regions. The first germanium region is in contact with a first tensile stressor so that the first germanium region has biaxial tensile strain in at least a first portion of the first germanium region. The second germanium region is in contact with a second tensile stressor so that the second germanium region has biaxial tensile strain in at least a second portion of the second germanium optically active region. Optical elements define an optical path through the first and second germanium regions. A junction is positioned in or adjacent the first and second portions of the first and second germanium regions, the junction having a first side with a first majority carrier type and a second side with a second majority carrier type. First and second contacts are respectively coupled to the first side of the junction and the second side of the junction.

According to another aspect of the present invention, an optical device comprises a germanium slab having first and second faces and first and second ends and first and second stressor layers on the first and second faces. The first and second stressor layers induce biaxial tensile stress within the germanium slab. Optical elements are positioned with respect to the germanium slab to define an optical path passing through the germanium slab.

According to another aspect of the present invention, an optical device comprises two or more germanium slabs each having first and second faces and first and second ends and first and second stressor layers on each of the first and second faces. The first and second stressor layers induce biaxial tensile stress within respective ones of the two or more germanium slabs. Optical elements are positioned with respect to the germanium slabs to define an optical path passing through the two or more germanium slabs.

According to still another aspect of the present invention, a method of making a semiconductor device comprises providing a substrate having a germanium region and etching openings into the germanium region. The method continues by forming silicon germanium within the openings to form a pattern of embedded silicon germanium surrounding a first portion of the germanium region, the silicon germanium regions and the first portion of the germanium region having in-plane biaxial tensile strain.

Still another aspect of the present invention provides a method of communicating data comprising coupling an electrical signal into an optical device comprising a first strained semiconductor region to generate a responsive optical signal. The method continues by transmitting the responsive optical signal through a waveguide comprising a second unstrained semiconductor region and coupling the responsive optical signal into a detector comprising a third strained semiconductor region. The first, second and third semiconductor regions comprise germanium. In a more specific implementation of this aspect, these regions are essentially self-aligned to each other.

DETAILED DESCRIPTION OF THE PREFERRED EMBODIMENT

Figure 1:
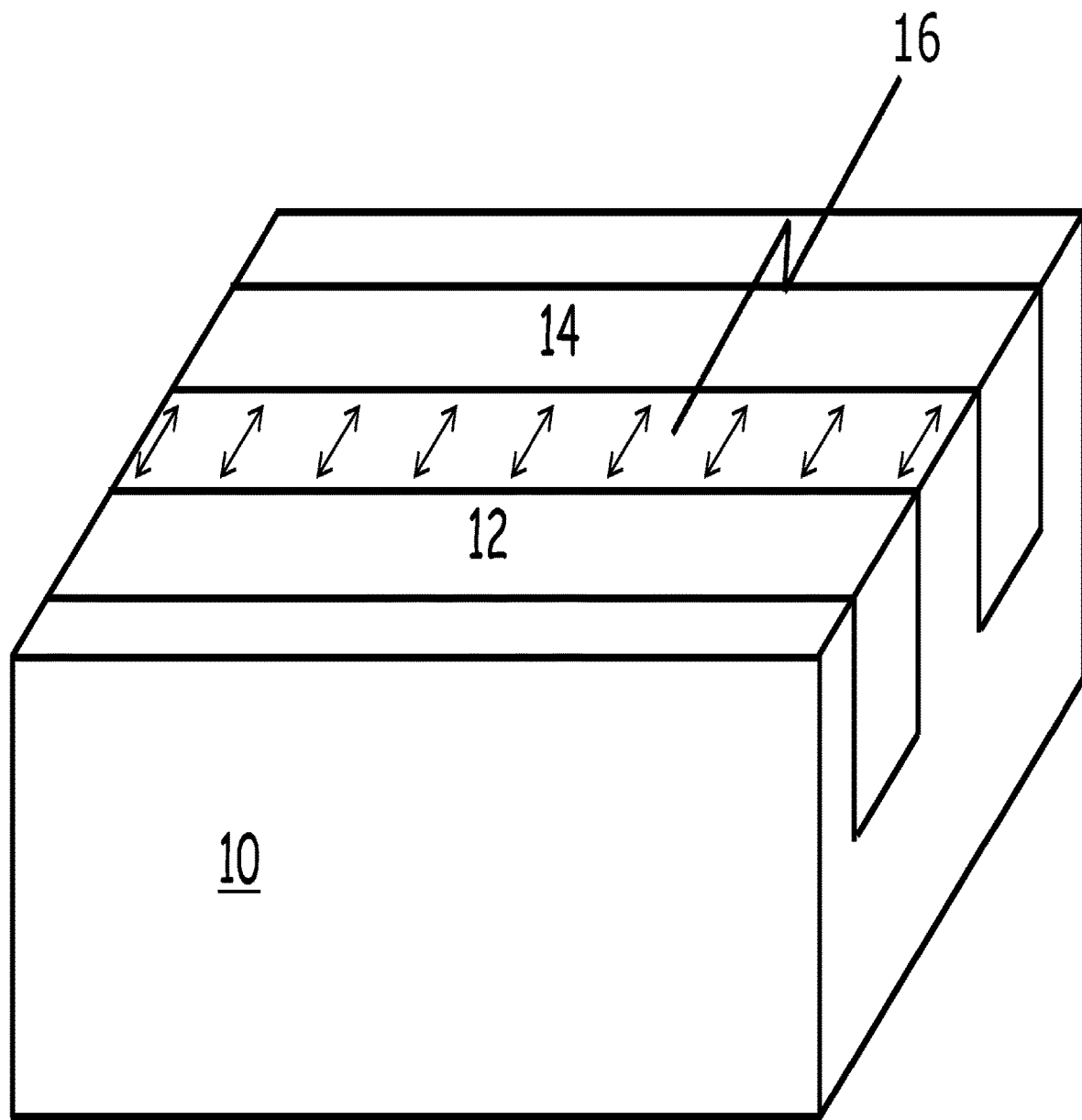
FIG. 1 schematically illustrates a portion of a light emitting or detecting device that can have a tensile strained active region.

Preferred embodiments of the present invention include a light emission or light detection device or method which uses a strained group IV semiconductor as the active region that emits or detects light. Light here is used in its broad sense to incorporate ultraviolet and infrared ranges. As one example, an implementation of the present invention might provide a semiconductor laser that uses tensile strained germanium as a gain medium. Most preferably, this specific example may use a germanium region biaxially tensile strained to a sufficient extent that at least a portion of the strained germanium region is a direct bandgap semiconductor.

Certain embodiments of the present invention may use a distinct optical layer made up of generally homogeneous materials to form various components of an optical layer including at least one light source, one or more waveguides, at least one routing or switching element, or at least one detector. Drive electronics are included, either in the optical layer or in another layer such as in an associated ULSI chip. For the homogeneous material case, the material constituting the components is of course physically somewhat different, because the use of a homogeneous material system necessitates the local change of some of the optical properties of the material in question, to turn it variously from light emitting (direct bandgap) semiconductor material, to optically transparent (indirect bandgap) waveguide material or to light detecting (direct bandgap) semiconductor material.

Most preferably, the variations needed to achieve the desired local optical properties are created, e.g., through the application of external strain, in particular bi-axial or uni-axial tensile strain. In addition, preferred implementations locally alter the electrical properties of the semiconducting material in question in the usual ways such as dopant ion implantation or diffusion to build electrical devices in the usual manner.

Certain preferred embodiments define an optical layer from a generally homogeneous material system for which some of the semiconductor material in select components either is made to have a fully direct or fully indirect bandgap. In particularly preferred embodiments, the bandgap in the emitter or detector is lower than the bandgap of the waveguide, so that the waveguide is essentially transparent to the photons emitted by the emitter or detected by the detector. In the case of a waveguide formed of a semiconducting material with an indirect bandgap, leaving the material of the waveguide unstrained allows the material to retain a larger bandgap than the strained emitter or detector material. The larger bandgap in the waveguide together with the indirect nature of the bandgap result in a lower optical transmission loss in the waveguide material.

For particularly preferred implementations that use strained germanium for active light emission or absorption, the source and the detector will be turned from being an indirect semiconductor (and therefore a relatively inefficient optical emission/absorption material) to a more direct semiconductor (and correspondingly to an efficient optical emission/absorption material). In stating that the tensile strain in the germanium causes it to become a more direct band gap semiconductor it is meant that the tensile strain causes optical transitions corresponding to the direct transition between the conduction band minimum at the gamma point to the valence band to be more probable due to the reduced energy gap between the conduction band minimum and the valence band at the gamma point. That is, highly tensile strained germanium exhibits a strong enhancement of luminescence corresponding to the direct transition at the gamma point. This strong enhancement of luminescence can be exploited to manufacture efficient light emitting devices including light emitting diodes and semiconductor lasers in germanium.

In the case of a semiconducting material with a direct bandgap such as gallium arsenide, the waveguide can be turned into a non-absorbing semiconductor through application of compressive stress along at least one axis that increases the bandgap in the waveguide and makes it more transparent for wavelengths that are emitted from unaltered bulk gallium arsenide. As a result transmission losses through absorption are reduced.

The following describes several illustrative implementations of methods and devices that can form components of photonic systems with strained semiconductor light emitting or detecting elements.

Group IV semiconductors generally exhibit the diamond structure and as such have the principal directions <100>, <110> and <111>, which are representative of the symmetry of the crystal structure. These axes are normal to the (100), (110), and (111) lattice planes, respectively. Deformation of the natural equilibrium lattice (distances between atoms and angles between atoms) leads to changes in the band structure. For example, to first order, hydrostatic pressure results in a homogeneous volume compression of a cubic lattice and most commonly to an increased direct bandgap. For germanium the effect of uniaxial, biaxial and hydrostatic strain on the band structure has been of scientific interest for a long time.

The application of biaxial tensile strain within the (100) plane of germanium renders the material more direct, i.e., an increase in (100) biaxial strain narrows the direct bandgap more rapidly than the indirect bandgap. Calculations of the band structure of biaxially tensile strained germanium predicts that the material becomes fully direct at about 1.9% of strain in the (100) plane. Furthermore, uniaxial deformation is reported to lead to a direct bandgap when applying uniaxial tension along the <111> direction of germanium. Of course, a large number of strain orientations and configurations with respect to the principal directions of a crystal can provide different advantages for turning an indirect bandgap material into a more direct bandgap material.

FIG. 1 shows an example in which embedded silicon germanium (SiGe) stressors are used to tensile strain a germanium region (such as a fin or stripe) which can be used either for light emission or light detection. In a preferred embodiment multiple tensile stressors are embedded in a germanium layer causing a tensile strain in the volume of germanium between any two neighboring tensile stressor regions. SiGe alloy is a suitable tensile stressor material when grown epitaxially inside a recess formed in a germanium surface. SiGe alloy has a crystal lattice spacing that is smaller than the crystal lattice spacing in germanium. Therefore, when a thin film of SiGe is grown epitaxially on a germanium surface the SiGe is under tensile in-plane lattice misfit strain. A tensile strained embedded SiGe stressor induces tensile strain in laterally adjacent germanium. As a more concrete example, FIG. 1 illustrates a portion of a germanium layer 10. Two long trenches are cut in the surface of germanium layer 10 and are filled by epitaxial deposition of SiGe to form embedded stressors 12, 14 on either side of germanium region 16. The embedded SiGe stressors 12, 14 on both sides of the narrow strip of germanium 16 induce uniaxial tensile strain in the volume of germanium between the SiGe stressor regions as indicated in FIG. 1. The narrow strip of tensile strained germanium 16 may be used as a light emitting active region of a laser or diode or as a light detecting region of, for example, a photodiode. The height or thickness, width and length of these structures are preferably selected to achieve desired levels of strain to achieve the optical functionality appropriate to the component. Preferably, the dimensions are selected according to the specific implementation and the other elements of the component.

Advanced CMOS technologies frequently include embedded SiGe source or drain (S/D) regions in the manufacture of high performance p-channel field effect transistors. In the case of SiGe source drain regions embedded in a silicon transistor a compressive strain is obtained in the silicon region between the SiGe stressors. This is the inverse of the strain condition that arises when SiGe stressors are embedded in a germanium device as described here but the manufacturing processes and technologies, design considerations and implementations are very similar.

Figure 2:
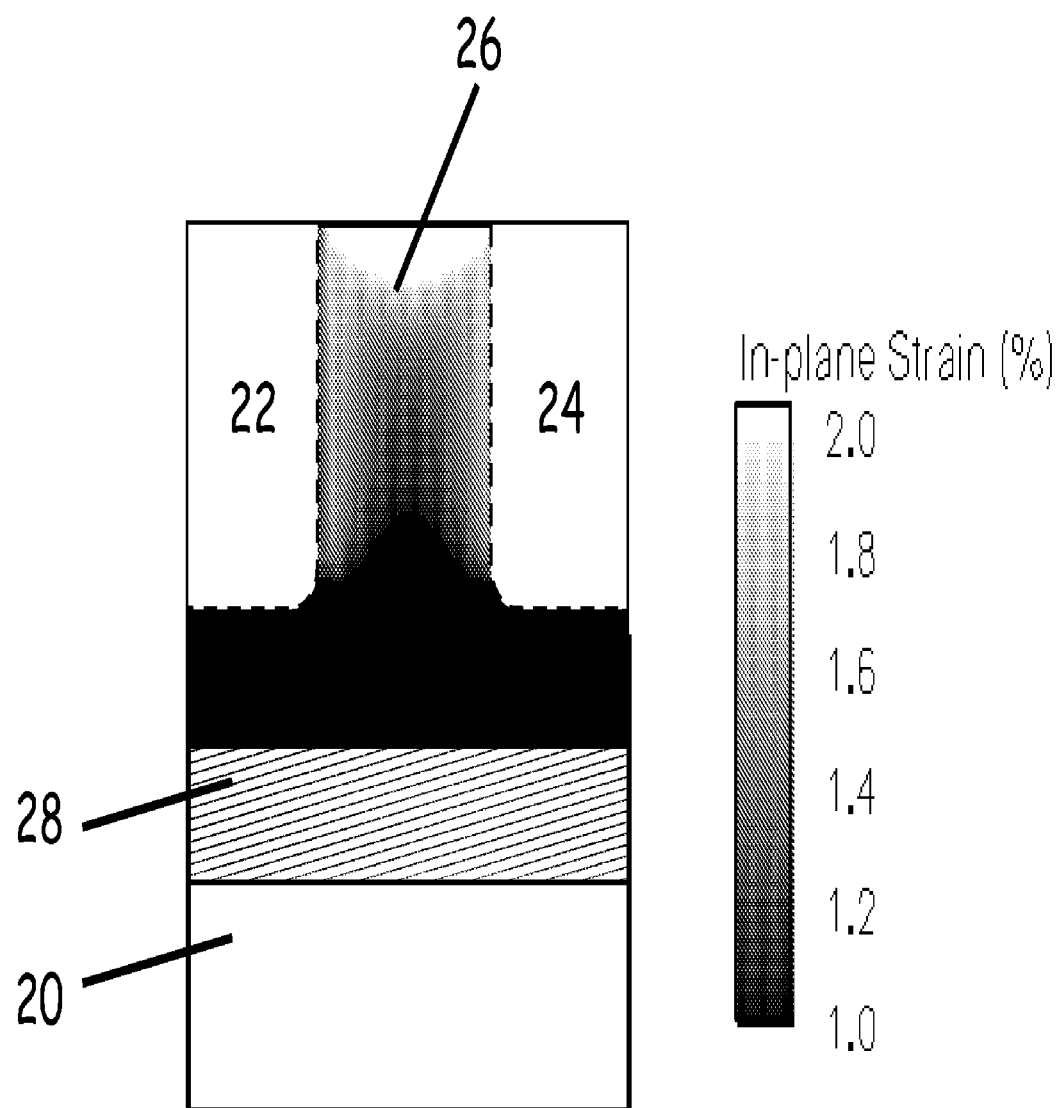
FIG. 2 illustrates the results of a simulation based on the FIG. 1 structure that shows a high level of induced strain within a germanium strip between embedded silicon germanium stressors.

FIG. 2 illustrates a simulation of a structure generally like that shown in FIG. 1, with FIG. 2 showing a cross section perpendicular to the longer axis of the stripe. The FIG. 2 simulation uses a slightly more complicated and practical structure including a buried insulating layer 28 between a silicon or other wafer or substrate 20 and a layer of germanium 26 in which trenches are formed and subsequently at least partially filled with silicon germanium to form tensile stressor regions 22 and 24. As shown in the simulation of FIG. 2, high levels of strain can be induced, especially near the upper surface of the germanium stripe 26.

Figure 3:
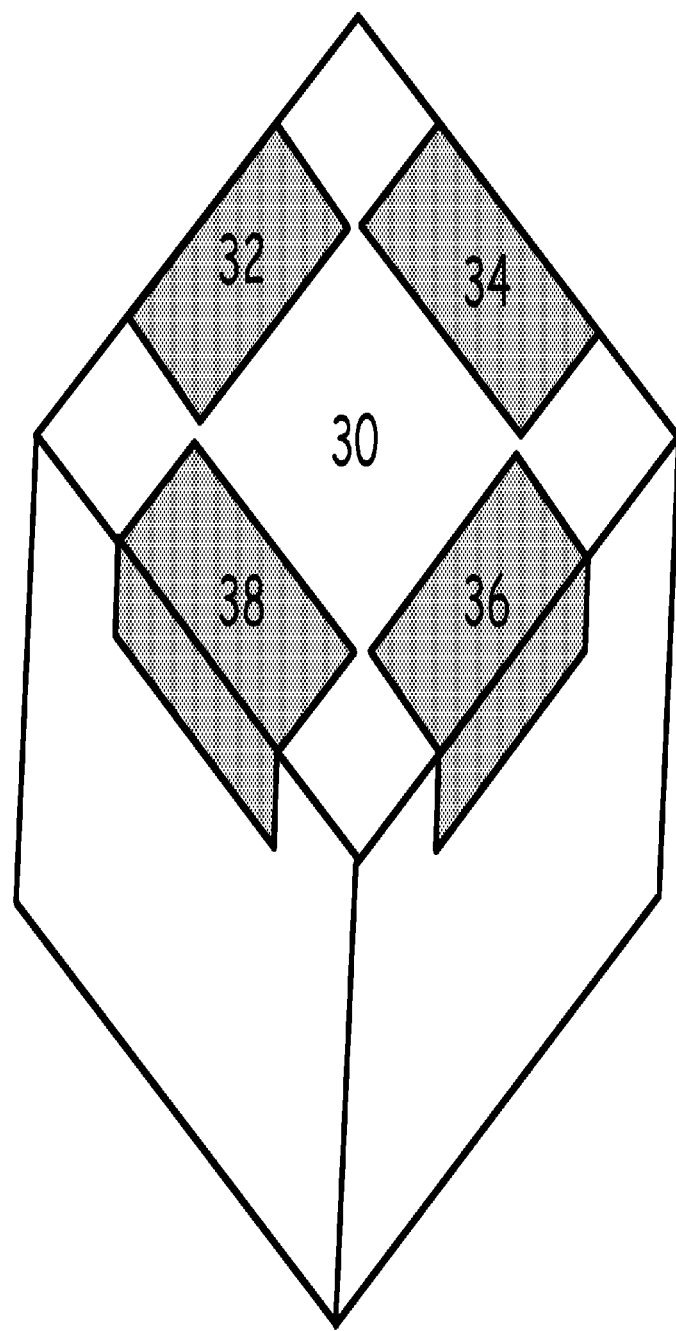
FIG. 3 illustrates schematically a germanium region surrounded by a pattern of embedded stressors such as silicon germanium or silicon nitride, where the embedded stressors have a generally rectangular surface cross section.
Figure 4A:
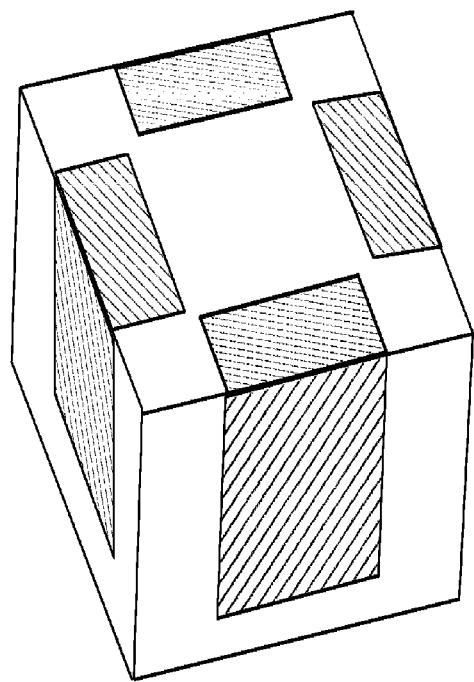
FIG. 4(a) illustrates in perspective a germanium layer with an array of separate embedded stressor regions composed of a material under tensile in plane stress such as silicon germanium or silicon nitride, where the embedded stressor regions have a generally rectangular surface cross section and the stressor regions induce tensile strain in the adjacent germanium regions.
Figure 4B:
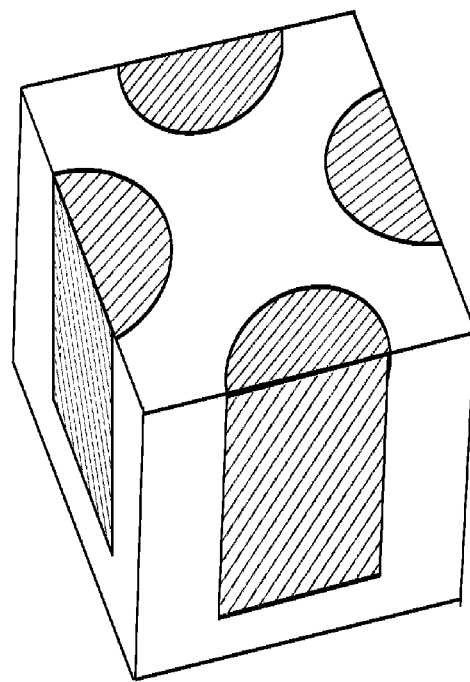
FIG. 4(b) illustrates in perspective a germanium layer with an array of separate embedded stressor regions composed of a material under tensile in plane stress such as silicon germanium or silicon nitride, where the embedded stressor regions have a generally rounded or circular surface cross section and the stressor regions induce tensile strain in the adjacent germanium regions.
Figure 4C:
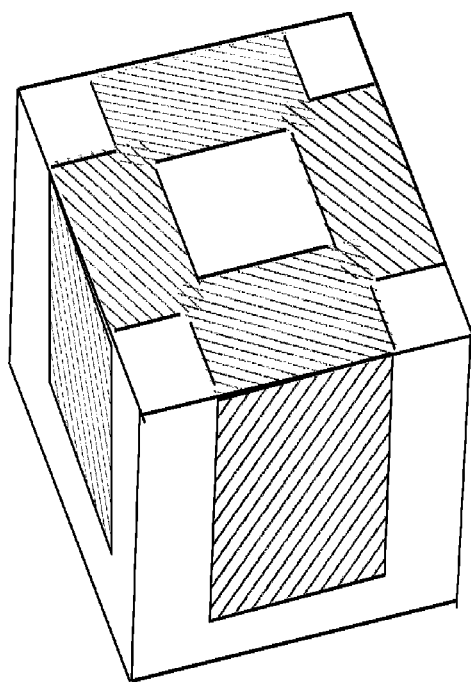
FIG. 4(c) illustrates in perspective a germanium layer with an array of connected embedded stressor regions composed of a material under tensile in plane stress such as silicon germanium or silicon nitride, where the embedded stressor material surrounds the periphery of pillar shaped regions of germanium, the germanium pillar regions having a generally rectangular surface cross section and the stressor material inducing in plane biaxial tensile strain in the adjacent surrounded germanium regions.
Figure 4D:
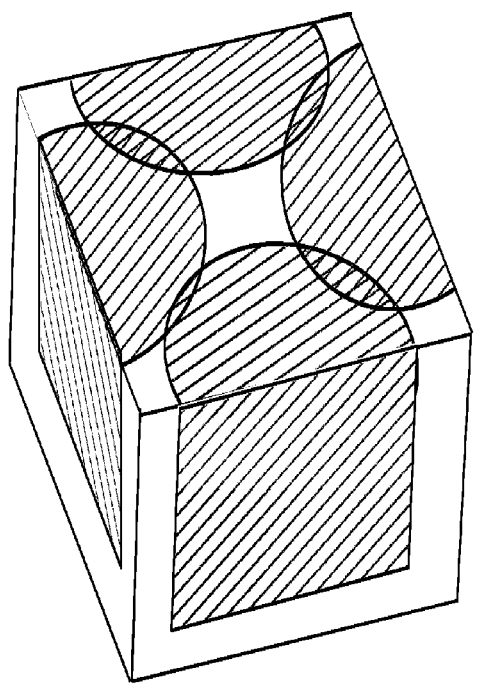
FIG. 4(d) illustrates in perspective a germanium layer with an array of connected embedded stressor regions composed of a material under tensile in plane stress such as silicon germanium or silicon nitride, where the embedded stressor material surrounds the periphery of pillar shaped regions of germanium, the overlapping embedded stressor regions having a generally rounded or, in the limit, circular surface cross section and the stressor material inducing in plane biaxial tensile strain in the adjacent surrounded germanium regions.
Figure 4E:
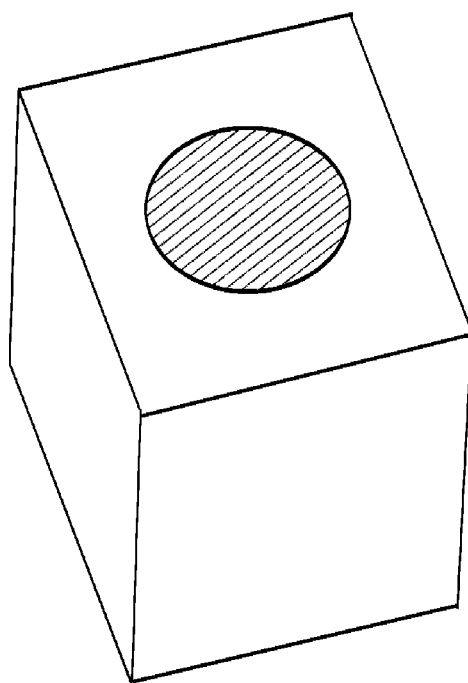
FIG. 4(e) illustrates in perspective a pillar shaped germanium region within embedded stressor regions composed of a material under tensile in plane stress such as silicon germanium or silicon nitride. The illustrated pillar may be one within an array of like pillar shaped regions of germanium, with the stressor material inducing in plane biaxial tensile strain in the surrounded germanium regions.

Alternatively SiGe stressors can be incorporated in a germanium laser or light emitting diode or photodetector in the form of a matrix of multiple embedded regions having depths and widths of approximately 100 nm by 100 nm. These dimensions are illustrative and a range of dimensions can be used effectively. The particular stated dimensions are useful for the illustrated configuration. In this strategy, the light-emitting active region of a laser (typical size 0.35 to 1.5 micron wide, or even wider, by 2 to tens or even hundreds of microns long, or even longer) or light-detecting region of a photodetector may consist of many regions of germanium with biaxial tensile strain induced along two in-plane axes by adjacent volumes of embedded SiGe. FIG. 3 depicts one element of such a matrix wherein biaxial tensile strain is induced in a central germanium region 30 by adjacent SiGe stressor elements 32, 34, 36, 38 formed on four sides. The stressor elements have a generally rectangular surface cross section that may, for example, be approximately square. The stressors are illustrated as silicon germanium, which provides tensile strain to the adjacent germanium regions. Other stressor materials might also be used, such as silicon nitride deposited to provide tensile stress. The strain distribution is generally inhomogeneous and dependent on the geometry and other relevant characteristics such as the composition of a silicon germanium stressor. The strain might, for example be highest around upper side portions of the germanium region. Biaxial strain may be maximal in a central portion of germanium region 30.

FIGS. 4(a-e) illustrate how a multitude of germanium elements may be arranged in a matrix so that each element has biaxial tensile strain in at least a part of the element. The germanium elements under biaxial tensile strain may be connected to neighboring germanium elements similarly under biaxial strain as shown in FIG. 4(a) and FIG. 4(b). Alternatively the germanium elements may be separated from neighboring germanium elements by the stressor material as shown in FIG. 4(c) and FIG. 4(d) in which case the separate germanium regions appear as pillars. Although the germanium pillar elements are separated by stressor material in the plane of the wafer, they may of course remain connected through their bases to a shared or common remaining germanium layer or substrate. Furthermore the germanium pillars may have a substantively square cross sectional profile or may be rounded having in the limit a circular cross sectional profile or a concave sided pillar profile as illustrated in FIG. 4(d). FIG. 4(e) shows one of an array of germanium regions within embedded stressor regions composed of a material under tensile in plane stress such as silicon germanium or silicon nitride. The illustrated pillar may be one within an array of like pillar shaped regions of germanium, with the stressor material inducing in plane biaxial tensile strain in the surrounded germanium regions.

In particularly preferred implementations of this embodiment, an array of strained germanium elements like that illustrated in any view of FIG. 4 may be used as the light emitting active region of a laser device or light detecting region of a photodetector device. The FIG. 4 light emitting active region consists of multiple at least partially biaxially tensile strained germanium elements. For the purpose of achieving a lasing action it is not necessary that the whole volume of the laser active region be formed of biaxially tensile strained germanium but it is desirable to maximize the proportion of the laser volume that is biaxially tensile strained germanium. In addition, it is desirable to induce sufficient tensile strain in the germanium regions so that the regions become direct bandgap over at least a portion of the regions. In the portion of a germanium region with the largest biaxial tensile strain the direct conduction band (gamma point) minimum is at its lowest energy. In particular for any portion of germanium with a biaxial strain of greater than about 1.8% to 2.0% the direct gap (at the gamma point) should be smaller than the indirect gap and that portion of the germanium may be considered a direct gap semiconductor. Under these conditions free electrons will drift to the portion with the most biaxial tensile strain (lowest conduction band energy) and this will coincide with the portion where the direct optical transitions are more favorable. As such, even though only a fraction of the germanium volume in a laser may have a biaxial tension sufficient to induce a direct gap behavior, this may be adequate for practical purposes of stimulated emission of photons because the direct gap portion is at the same time the portion of germanium to which free electrons are drawn by the built in field arising from the reduced conduction band energy level in that portion. Conversely the less strained portions of germanium that do not turn direct, will remain indirect and not provide light amplification. However, light emitted from the highly strained portions having the smallest and direct bandgap will not be absorbed in the less strained portions having a larger and indirect bandgap. Although the less strained portions of germanium are not expected to contribute significantly to light emission in the light emitting diode or semiconductor laser those portions also should not contribute significantly to losses. It is nevertheless desirable to maximize the fraction of the germanium in the optically active region that is under a high level of biaxial tensile strain.

Preferably for this configuration, the silicon germanium stressors are not doped or are not doped n-type to avoid pinning the germanium conduction band and to facilitate the described effect of funneling carriers into the gain region by laterally varying the conduction band. The embedded stressors could alternatively be formed of silicon nitride deposited with built-in tensile stress. Methods and tools are well known in the silicon integrated circuit manufacturing industry for depositing films of silicon nitride with built-in tensile stress.

Figure 5:
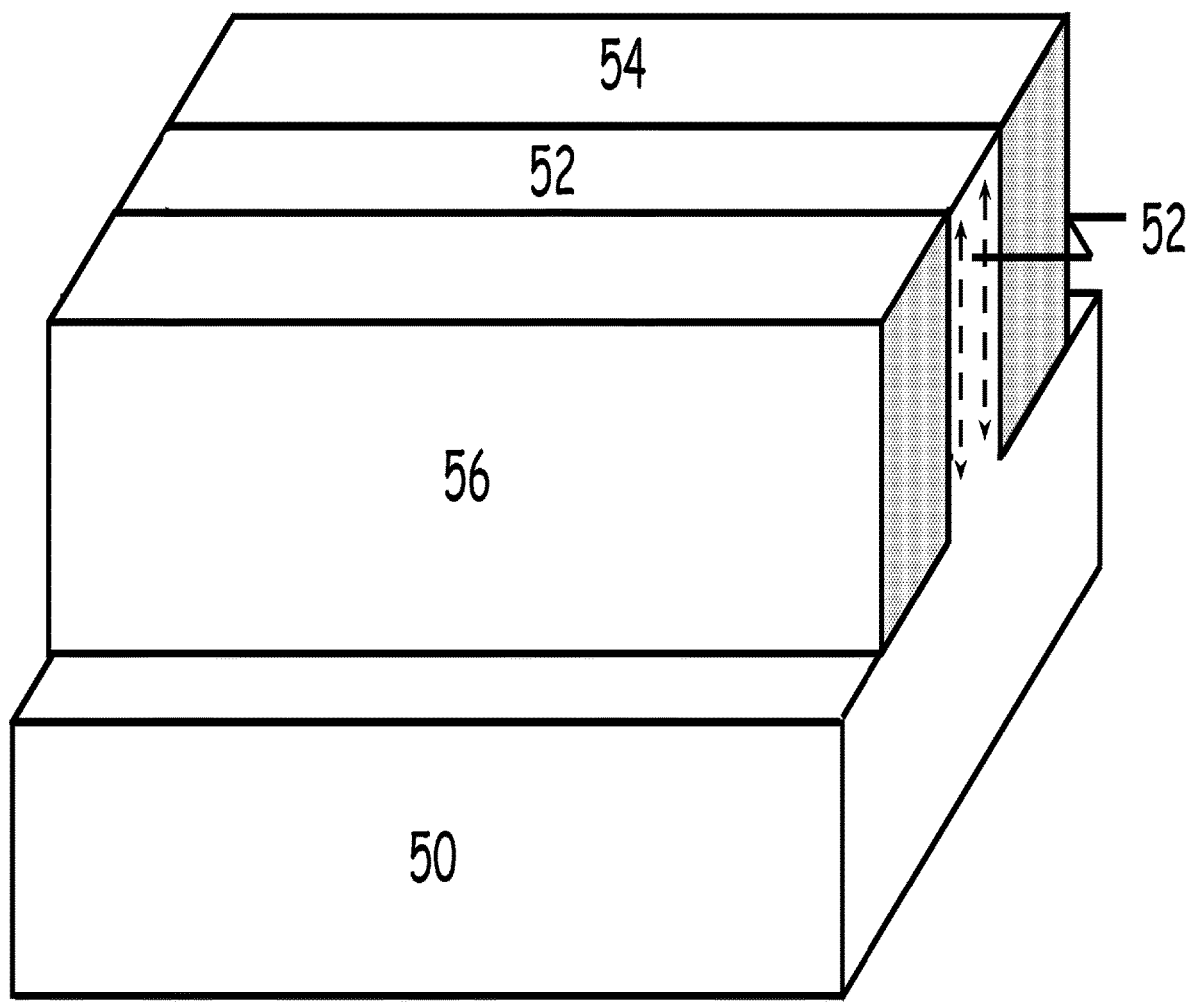
FIG. 5 illustrates another implementation of aspects of the invention in which tensile strain is created in a fin of germanium through force imposed by compressive stressor layers on sidewalls of the germanium fin.

In the embodiment illustrated in FIG. 5, a germanium substrate 22 is patterned and etched to form a germanium fin structure 52 extending above the remaining portion of the substrate 50. Fin structure 52 may, for example, be 0.05 μm in width and 0.15 μm in height. Compressive stressors 54, 56 are formed on the side walls of the germanium fin 52 to impart uniaxial tensile strain in the germanium fin as represented schematically by the arrows in FIG. 5. Typically, the illustrated structure is formed by depositing a conformal blanket layer of compressively stressed silicon nitride. The stressed silicon nitride is then preferably etched away from the top of the fins to allow for electrical contact to the tops of the fins by etching the silicon nitride layer to leave silicon nitride only along the sidewalls. Because the initial stress in the sidewall stressors is compressive, the sidewall stressors 54, 56 expand vertically when they relax and induce tensile strain in the germanium fin structure 52.

Methods and tools are well known in the silicon integrated circuit manufacturing industry for obtaining deposited films of silicon nitride with built-in compressive stress and methods are known for forming sidewalls of a material such as silicon nitride by deposition and subsequent anisotropic etch. Sidewall stressors alone will impose a uniaxial tensile strain in the germanium fin directed vertically, orthogonal to the plane of the semiconductor workpiece or wafer. Here again, the FIG. 5 tensile strained germanium fin active region 52 can act as light emitting region or a light detecting region, depending on the geometry and subsequent processing. Preferably the original strain in the sidewall stressor structures 54, 56 and the dimensions of the fin 52 are appropriate to create sufficient vertical (uniaxial) tensile strain to cause a portion of the fin active region 52 to have a direct band gap. Earlier or subsequent processing can be used to form a generally horizontal p-n junction in the illustrated fin structure. For example, the illustrated fin structure might be formed as p-type material. A highly n-type doped polycrystalline germanium layer is formed on an upper surface of the p-type fin 52. Subsequent annealing causes n-type dopants to diffuse into the fin structure 52 preferably to form a generally horizontal p-n junction. Preferably the p-n junction is positioned sufficiently adjacent the tensile strained portion of the fin structure 52 to allow the junction to be an efficient photon emitter or detector. For photon emission, electron hole pairs are generated by flowing current through the junction and photons are emitted through electron-hole radiative recombination associated with the preferred direct band gap. For photon detection, the p-n junction is reverse biased so that photons generate electron hole pairs that separate and are detected as an electrical current through the junction. In photon emission implementations, it is sometimes preferred that end faces of the germanium fin are coated with one or more reflective layers to achieve a resonant cavity In positioning the junction, it is preferred that the junction be located so that photon absorption (through creation of an electron hole pair) or emission (through radiative recombination of an electron hole pair) occurs to a sufficient extent in a portion of the germanium that is tensile strained sufficiently to provide a direct band and to provide efficient photon detection or emission. Alternately, the tensile strained portion of the germanium preferably includes the lowest band gap for a direct optical transition when current injection or other strategy is used with the reduced band gap to achieve efficient emission. Such an appropriate positioning of a tensile strained region and a junction or portion of a junction is identified here as adjacent and includes those positionings where the junction portion is coincident with a region of locally maximum tensile strain and those where there is an offset between those positions. The possible acceptable size of an offset is dependent on the level of strain achieved, the application and the device geometry. This discussion is made specific to the comparatively simple geometry of FIG. 5 but applies equally to the more complicated and other implementations discussed with respect to the other figures. In addition, the positioning and other considerations are also applicable for those implementations where tensile strain is insufficient to accomplish direct bandgap transitions. In those situations, the principles discussed here apply, but preferably are combined with desired doping, bias and/or current to achieve sufficient photon emission or detection to be useful. For any laser application, properly reflective ends of a cavity preferably are provided, losses are maintained at a suitably low level and sufficient current is provided so that the cavity provides gain in the manner known in the art. This discussion references a junction or junctions. In many cases, the junction will not be a sharp p-n junction but might effectively be a p-i-n junction with p-type and n-type regions positioned on either side of an active layer that preferably is undoped. A similar p-n or p-i-n junction may be used in both light emitting laser diode (or LED) devices and in photodetector devices.

Figure 6:
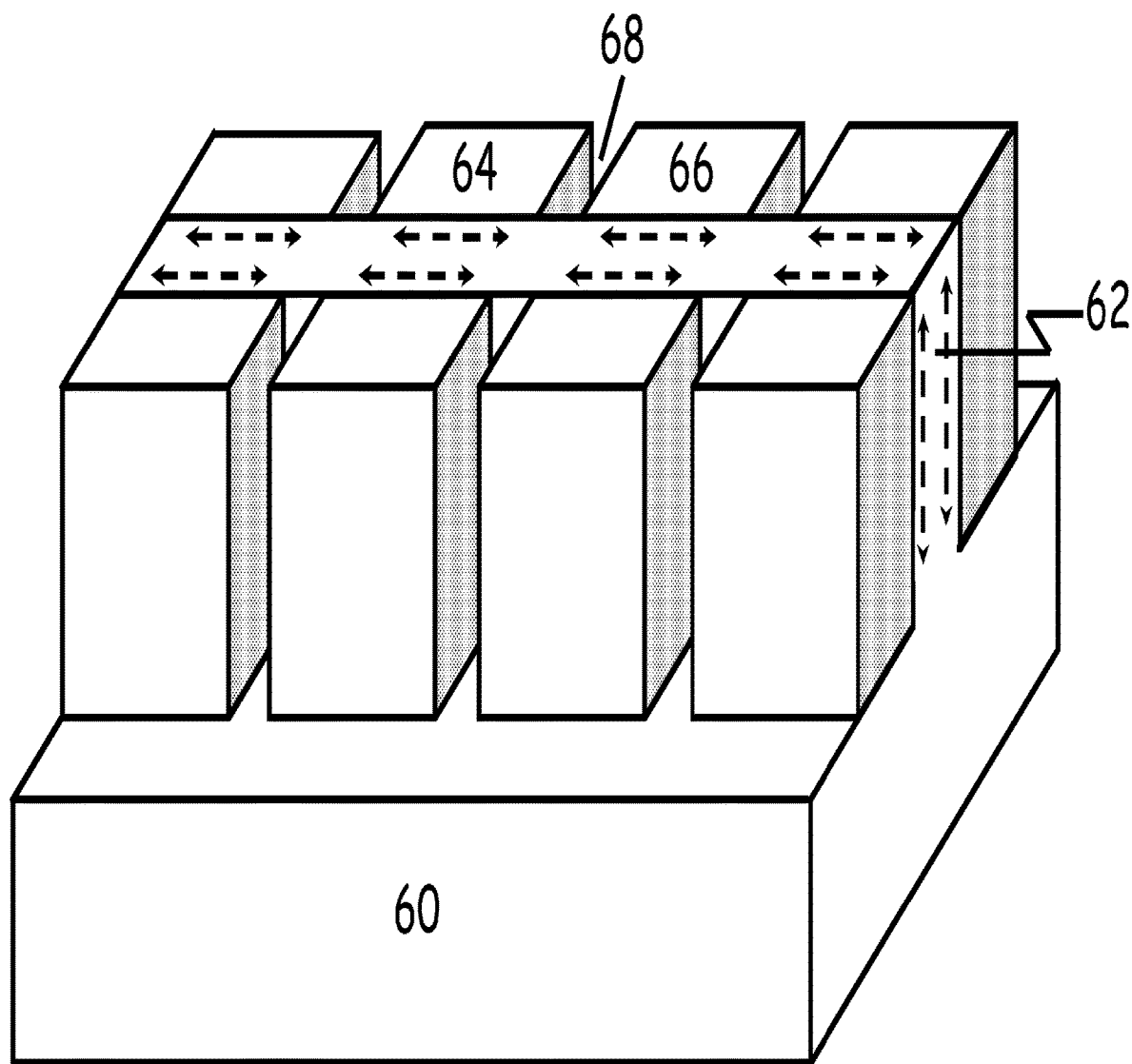
FIG. 6 illustrates a modification of the FIG. 5 strategy in which biaxial tensile strain is created in the germanium fin by patterning of the compressive stressor layers on the sidewall of the germanium fin.

In a further enhancement of the sidewall stressor method, narrow cuts may be etched into the silicon nitride compressive stressor layer along the length of the fin making the sidewall silicon nitride discontinuous along the length of the fin. This is illustrated in part in FIG. 6, where a narrow cut 68 has been etched through one of the compressively stressed silicon nitride sidewall structures to form multiple sidewall compressive regions 64, 66 that can expand both vertically and laterally to induce both vertical and horizontal strain components in the germanium fin 62. At the breaks or cuts in the silicon nitride sidewall, edge relaxation (i.e., relaxation facilitated by expansion or contraction at the comparatively unconstrained edges of the stressors) causes an additional stress component to be induced in the adjacent germanium fin directed along the length axis of the fin, as shown in FIG. 6. This configuration induces biaxial tensile components of strain in segments of germanium active region 62 which is desirable for modifying the germanium band structure to reduce the band gap for direct optical transitions, preferably to an extent that the direct optical transition is the lowest energy transition. As illustrated in FIG. 6 the additional vertical cuts in the compressive silicon nitride sidewall layers may be vertical although the cut lines also may be at a different angle.

An alternative method to obtain biaxial tensile strain in the germanium active element of the laser or photodetector introduces breaks or cuts in both the sidewall stressor elements and the germanium waveguide along the length of the fin to better induce biaxial tensile strain components in the germanium fin. If cuts are etched into the germanium fin waveguide, the gaps in the germanium along the length axis of the laser or photodetector may be undesirable as they will act as partial mirrors causing unwanted internal reflections or scattering of light generated in the laser active region or of light in the photodetector. This undesirable behavior may be limited by depositing amorphous germanium in the gaps. The edge relaxation that occurs when the gaps are etched in the germanium is sufficient to induce tensile strain along the length axis of the germanium fin waveguide or active region. Subsequent refilling of the gaps with, for example, amorphous germanium does not remove the tensile strain but does largely remove the dielectric discontinuity in the waveguide or active region of the laser or photodetector along the length axis. That is, the refilling of the gaps with a suitable material such as amorphous or polycrystalline germanium restores a continuous optical medium along the longitudinal optical axis of the laser or photodetector active region but with discontinuous tensile strain along the longitudinal optical axis of the laser or detector active region.

Figure 7A:
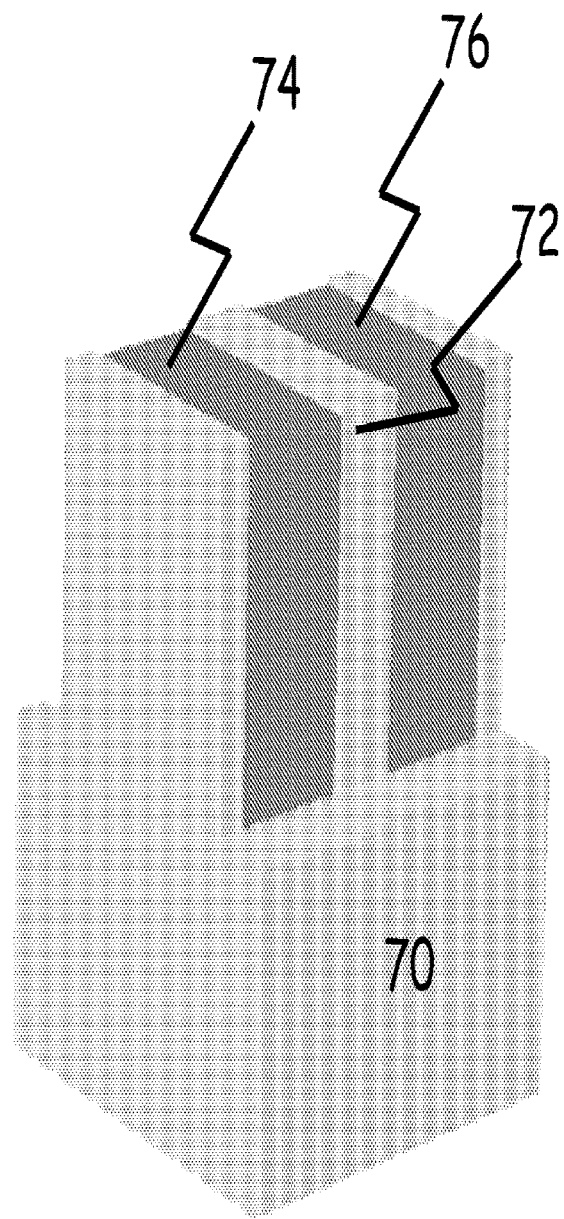
FIGS. 7(a-b) illustrate using three dimensional simulation a further modification of the strategy of FIGS. 5 and 6 in which a plurality of biaxially tensile strained germanium fins are provided along an optical path.
Figure 7B:
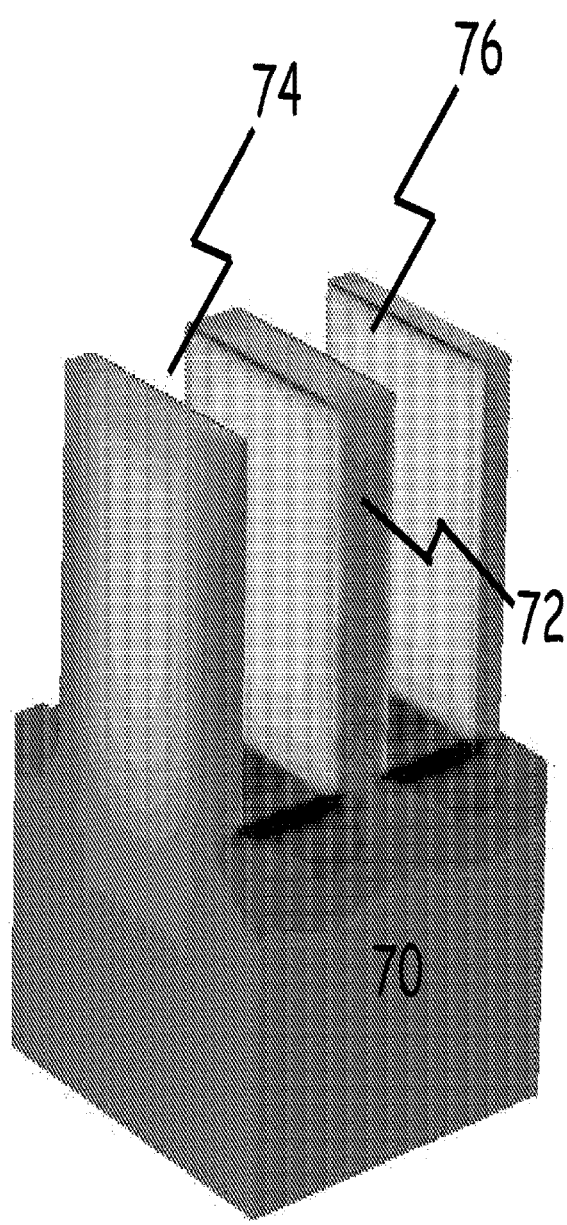

FIG. 7 illustrates a three dimensional simulation of a further modification of the strategy of FIGS. 5 and 6. FIG. 7 shows a number of fins, each a fin of germanium 72 with a dielectric (or insulating) stressor 74, 76 formed on either side of the germanium fin. Each of these fins may be formed in the manner discussed above with respect to FIGS. 5 and 6, including the etching, doping, contact and junction formation strategies discussed there. Preferably the dielectric stressors are initially formed to have compressive stress that is relaxed through etching to induce tensile stress in the germanium fins 72 between the stressors 74, 76. One suitable stressor is silicon nitride, which can be deposited to have compressive stress that can be relaxed through appropriate etching strategies. As shown in FIG. 7(a), the dielectric stressor layers 74, 76 can fill the gap between adjacent fins 72 and effectively induce a desirable level of biaxial tensile stress in the germanium fins. Simulated biaxial strain in the fins 72 is illustrated in FIG. 7(b) where the stressor regions have been rendered invisible to reveal contours of biaxial strain in the germanium as evaluated in the major planes of the fins, the lighter contours indicating greater magnitude of biaxial strain. The array of biaxally tensile strained germanium fins can be positioned so that an optical path, for example of a diode, laser diode or photodetector, passes through the FIG. 7 structure so that the optical path passes through a plurality of the fins in a direction parallel to the lateral fin faces on which the stressors are formed to induce stress. Alternately, the optical path of the exemplary diode, laser diode or photodetector passes through a plurality of the fins in a direction perpendicular to the lateral fin faces on which the stressor layers are formed to induce stress.

For the germanium fin structures discussed above in exemplary FIGS. 5-7, the fins may have a width (separation between dielectric stressor layers) of between about 20 nanometers and 100 nanometers and, more preferably, between about 40 nanometers and 80 nanometers. The fins preferably have a height (as measured above the remaining germanium layer adjacent the base of the fin) of less than one micron and, more preferably, less than 400 nanometers. The fins preferably have a length (as measured laterally along the face of the germanium layer adjacent one of the stressor layers) of less than one micron and, more preferably, less than 400 nanometers. For the implementations of FIGS. 5-7 and other implementations of the structures described here, it is preferred that the compressively stressed silicon nitride stressor material is formed to initially have a stress of greater than two gigapascals and, more preferably, greater than three gigapascals.

FIGS. 8-11 schematically illustrate elastic edge relaxation of compressive stressor layers on top or bottom surfaces of a germanium stripe or slab. Compressive stressor layers on the top surface (or top & bottom surfaces) of a germanium stripe laser or photodetector active region are patterned and etched in alignment with the active region. Edge relaxation occurs when a stripe pattern is etched through the top stressor layer, the active layer and, optionally, the bottom stressor layer. Compressive stress in the stressor layers induces tensile strain in the adjacent germanium active layer.

Figure 8A:
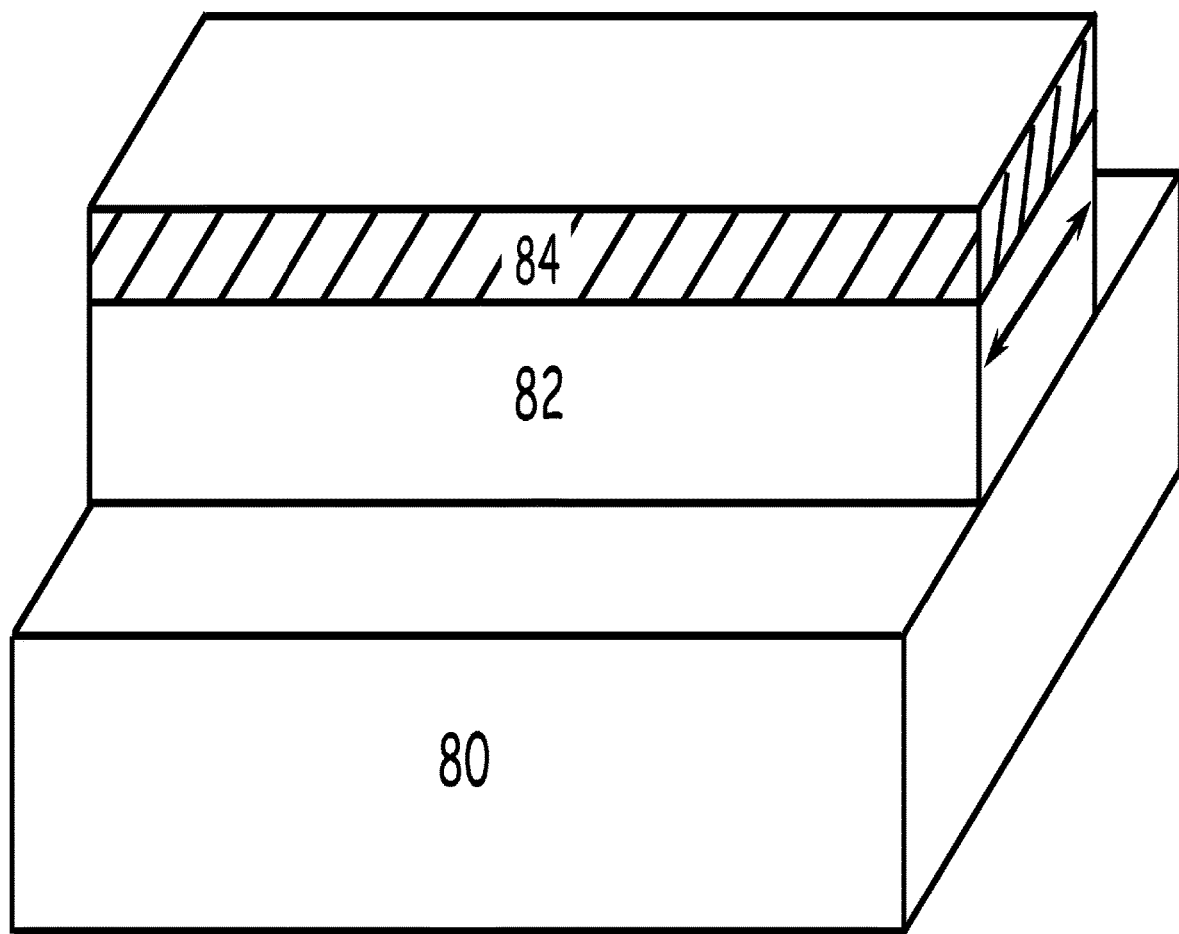
FIGS. 8(a-b) schematically illustrate a strained germanium strip where tensile strain is induced by an overlying compressively stressed material and edge relaxation.

In a first implementation of this strategy, illustrated in FIG. 8(a), a layer of compressively stressed silicon nitride is deposited on the surface of a germanium wafer or substrate 80. The process forms a mask on the silicon nitride layer and then etches through the silicon nitride layer and into the surface of the germanium wafer to form a stripe (or slab) of germanium 82 extending above the remaining portion of the wafer 80. The etching through the compressively stressed silicon nitride layer forms the stripe 84 and the etching continues into the substrate, allowing the compressively stressed silicon nitride 84 to relax and induce tensile strain in at least the upper portion of the stripe 82 of germanium. The resulting strained surface region of the stripe 82 can be used to generate photons or to detect them.

Figure 8B:
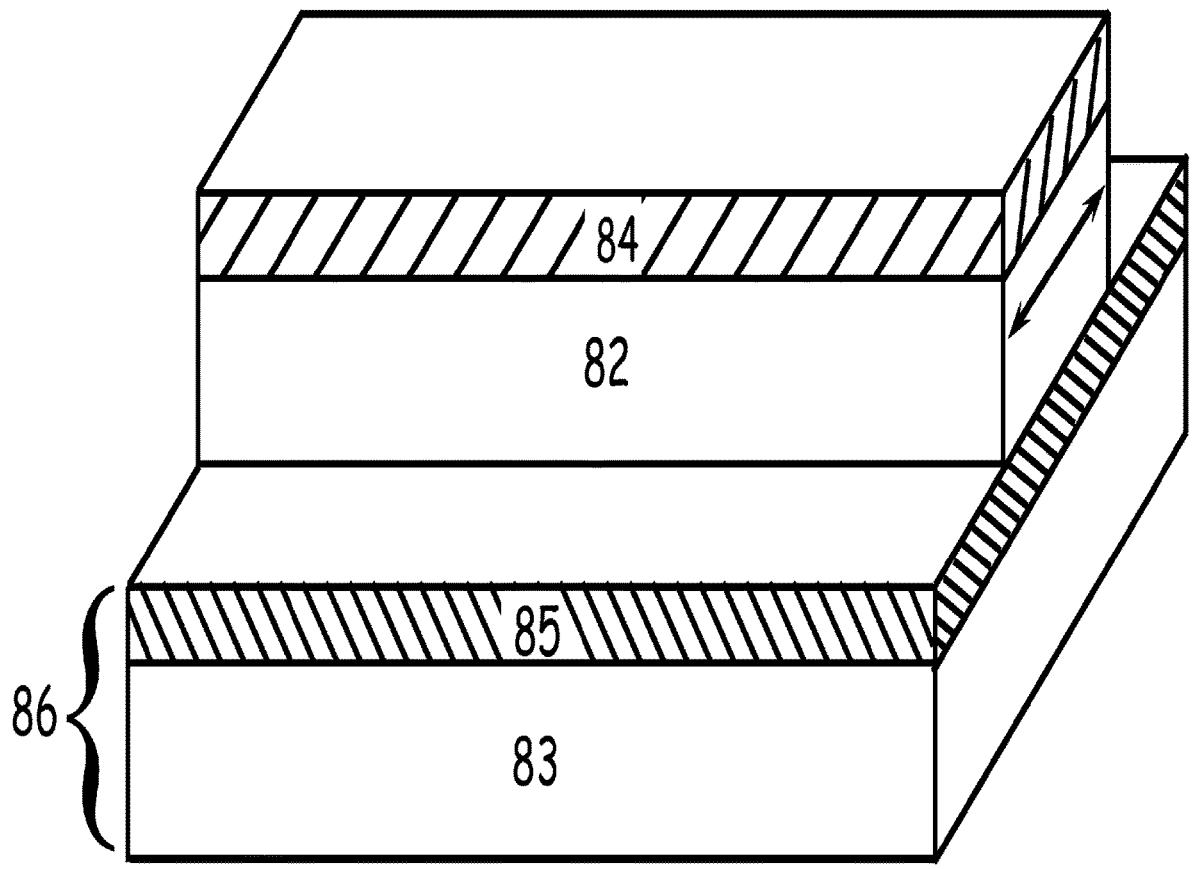

In a presently preferred implementation, a host wafer has a germanium layer wafer-bonded to the surface of the host wafer. For example, the host wafer 86 might be a silicon wafer 83 with a surface silicon oxide layer 85, or a portion of a silicon integrated circuit covered by a silicon oxide layer, and the germanium layer is bonded to the oxide surface in the well known manner. A compressively stressed stressor layer is then deposited on the germanium layer. For example, commercially available processes are available to deposit appropriate compressively stressed silicon nitride layers with a built in, as deposited stress of greater than two gigapascals or, more preferably, three gigapascals. The FIG. 8(b) structure is again formed by patterning and etching a compressively stressed stressor stripe 84 followed by etching a long stripe of continuous germanium active region 82, stopping at the surface of the wafer 86 as illustrated in FIG. 8(b). The edge relaxed surface stressor stripe 84 induces a uniaxial strain in the germanium stripe 82, as indicated by the arrow in FIG. 8(b). In alternative embodiments etching does not stop at the surface of wafer 86 but rather continues to a small depth into the surface of wafer 86 so as to induce a greater tensile strain in the germanium stripe 82. In other alternative embodiments etching stops before the surface of the wafer 86 is reached so that the germanium stripe 82 is in the form of a pedestal of germanium standing on a layer of unetched germanium.

Figure 9:
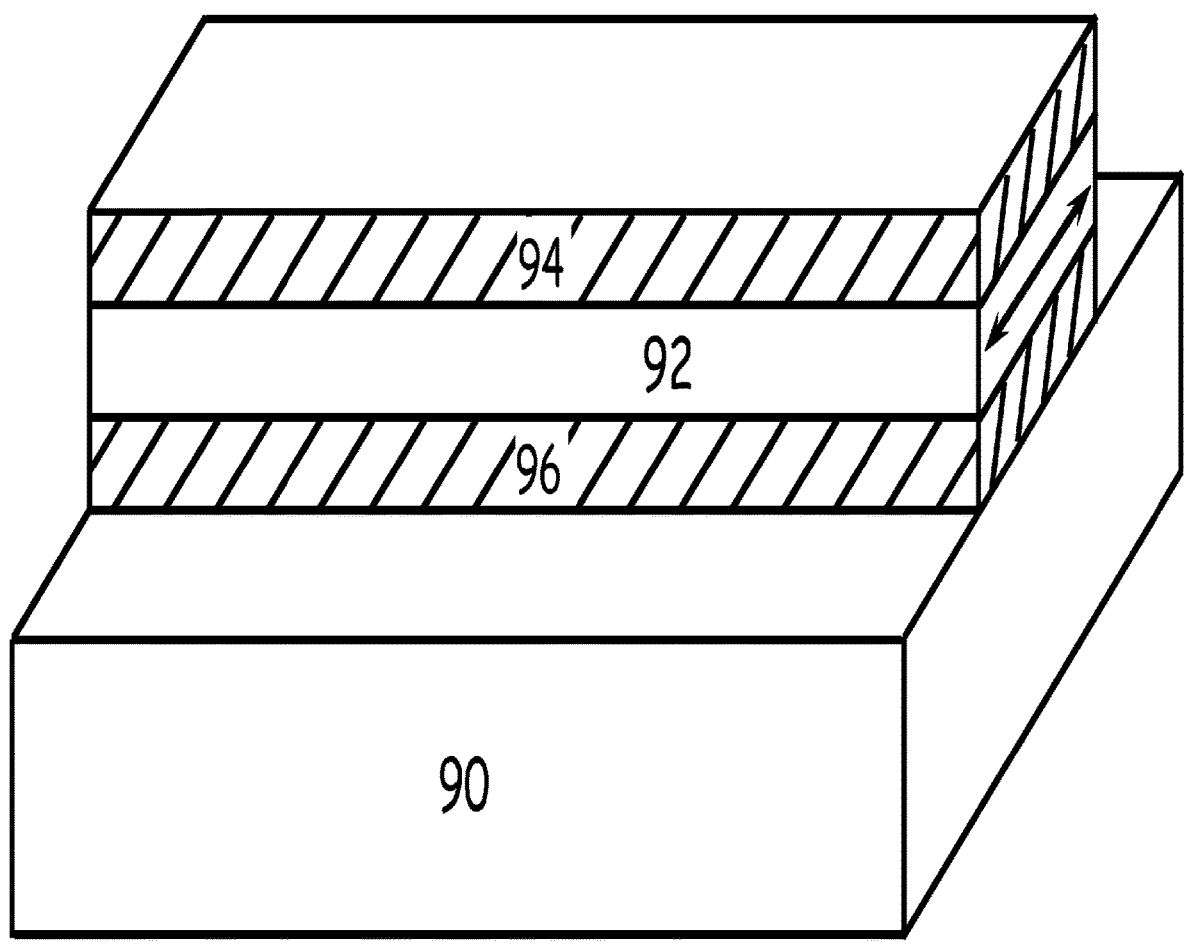
FIG. 9 schematically illustrates a strained germanium strip where tensile strain is induced by upper and lower layers of compressively stressed material and edge relaxation.

FIG. 9 illustrates another configuration that can, as compared to the FIG. 8(a)-(b) configurations, provide a greater level of strain to a germanium stripe to better emit or detect photons. The FIG. 9 structure is formed by sequentially depositing a first layer of compressively stressed material on a host wafer 90, providing a layer of crystalline germanium, and then depositing a second layer of compressively stressed material on the germanium layer. The first and second layers of compressively stressed material may, for example, be compressively stressed silicon nitride and the deposited materials are selected to function as stressors for the germanium layer. Processes for depositing such silicon nitride stressor layer are known. The FIG. 9 process continues by patterning and etching through the stack of layers to form an upper stressor stripe 94, a germanium stripe 92 that is uniaxially tensile strained in the direction illustrated by the arrow in FIG. 9. The etching may optionally continue through the compressively stressed second layer below the germanium layer to form the lower stressor stripe 96. Etching through or at least into the second compressively stressed layer is preferred as it provides more complete edge relaxation and results in a greater level of uniaxial tensile strain. The germanium stripe 92 preferably is between 0.04 and 1.0 microns wide and is preferably tensile strained to a sufficient extent that at least portions of the germanium stripe 92 have a direct bandgap.

A number of factors influence the level of tensile strain within the germanium layer, including the thickness of the germanium layer, the respective thicknesses of the upper and lower stressor layers and the level of compressive stress within the upper and lower stressor layers. Tensile strain also varies by the separation between the edge and whatever portion of the germanium layer is being considered. The non-uniform distribution of strain is true of all of the structures discussed or illustrated here. It is preferred that the tensile strain within this or other germanium regions discussed here (and elsewhere including above with respect to FIGS. 5-7) be adjusted to provide efficient photon emission or detection. It should nevertheless be appreciated that the structures and strategies described here can be used advantageously when lower levels of tensile strain are achieved, even when the material exhibits an indirect bandgap and photon emission relies on high carrier injection levels.

Figure 10:
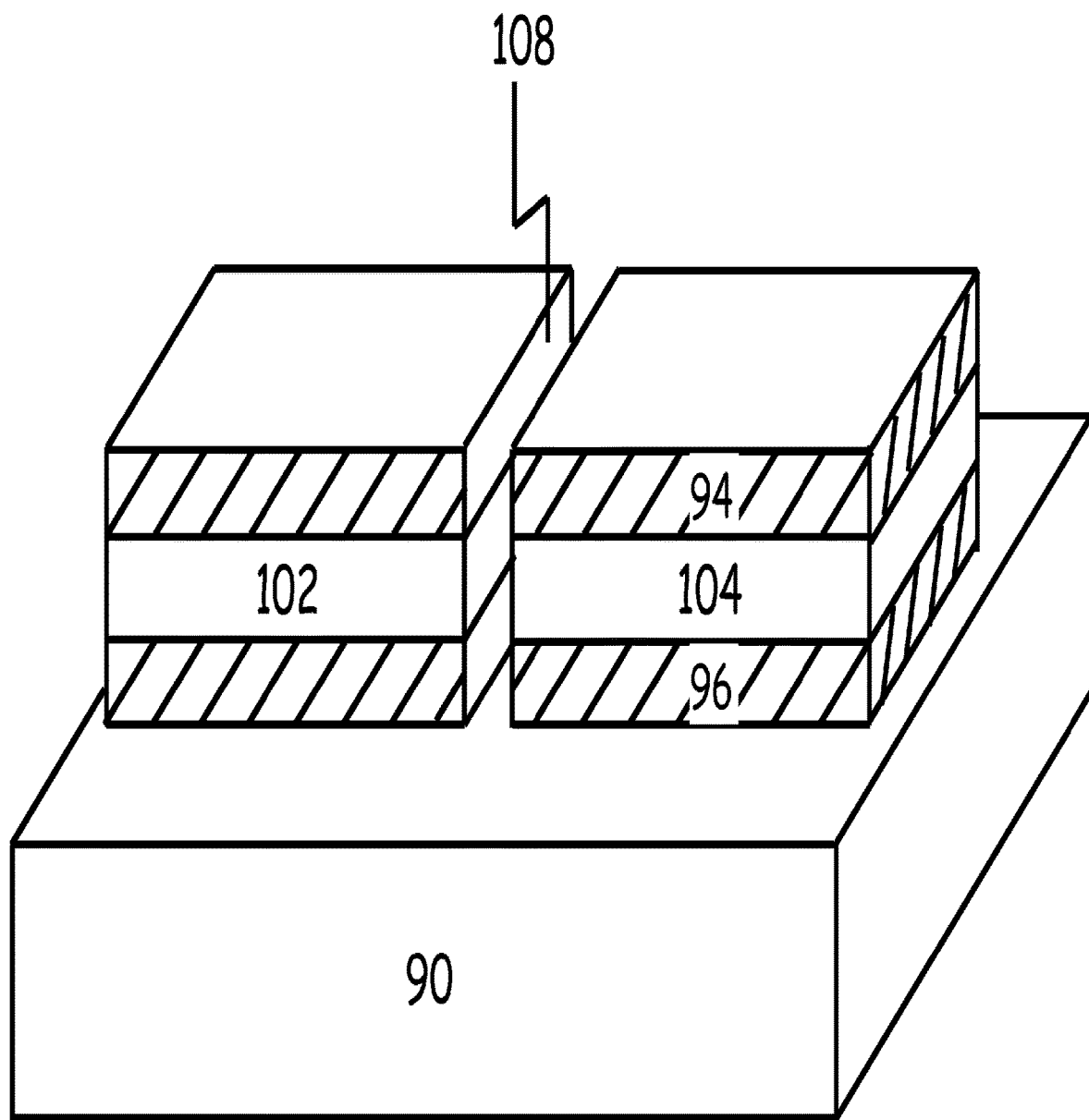
FIG. 10 schematically illustrates a strained germanium strip where biaxial tensile strain is induced in the strip by upper and lower layers of compressively stressed material and edge relaxation with cuts through the three layers along two axes.
Figure 11:
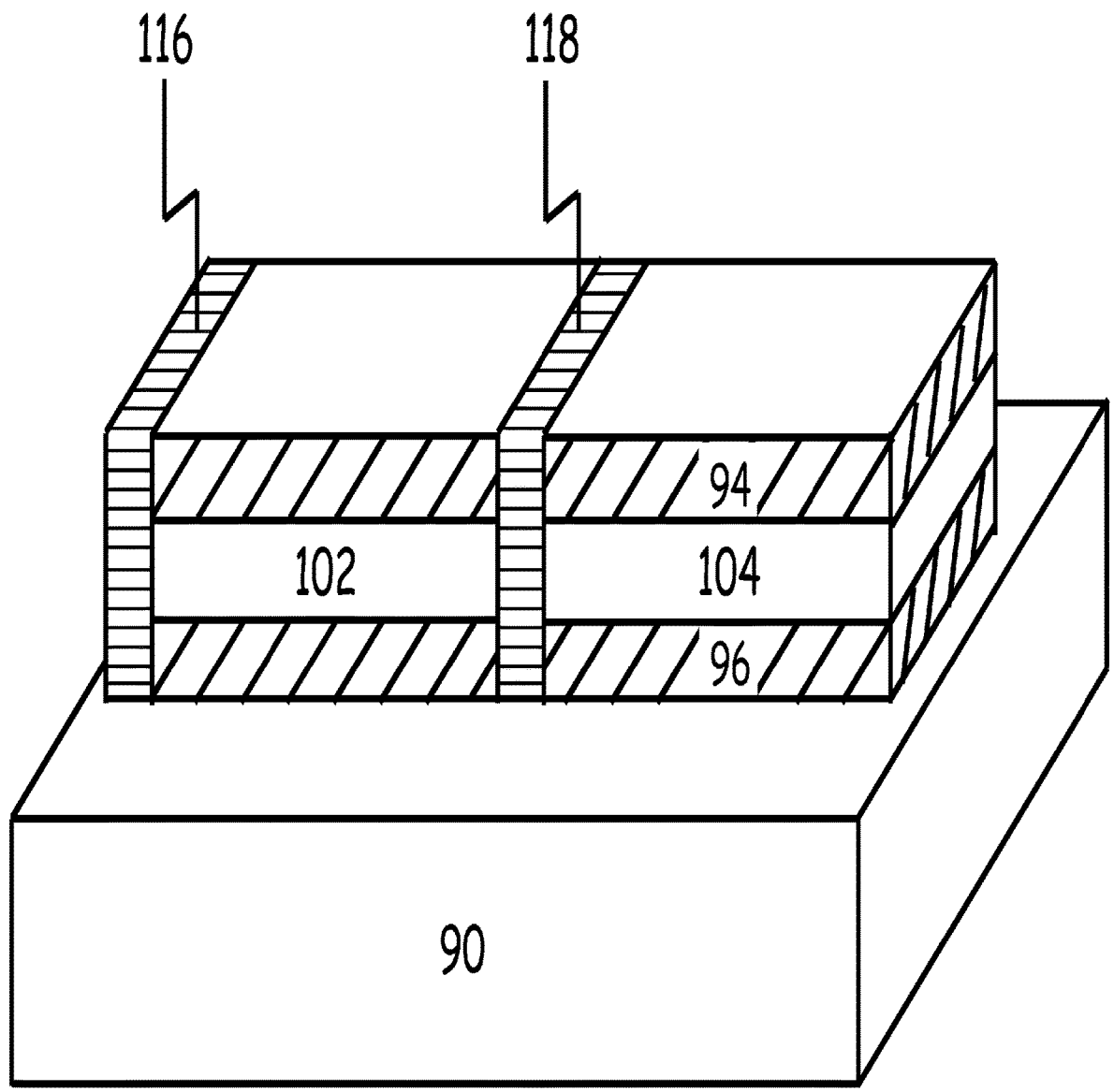
FIG. 11 illustrates a preferred further modification of the FIG. 10 strategy that limits internal reflections.

In other embodiments the patterning and etching is done to make additional cuts or breaks into the germanium stripe and the adjacent compressively stressed (as deposited) stressor layers along the length axis of the stripe, breaking the active region stripe into shorter segments of length typically in the range 0.04 to 1.0 microns. One such embodiment is illustrated in FIG. 10. The FIG. 10 implementation is like the embodiments illustrated in FIG. 9, except that when the stripe is patterned and etched, further patterning and etching is performed to open edges and a gap 108 between portions of the germanium stripe 102, 104.

The gap 108 allows the first and second stressor (upper and lower) stripe portions to elastically relax through edge relaxation to more efficiently induce tensile strain within the germanium stripe portions 102, 104. The edge relaxation that occurs when the gaps are etched in the germanium is sufficient to induce tensile strain in the germanium along the length axis of the germanium rib waveguide or active region. The longitudinal tensile strain is in addition to the transverse tensile strain induced along the width axis of the germanium stripe. This configuration induces biaxial tensile components of strain in segments of germanium active region which is desirable for modifying the germanium band structure to reduce the band gap for direct transitions. As illustrated in FIG. 10 the additional vertical cuts in the compressive silicon nitride sidewall layers may be vertical or the cut lines may be at a different angle than vertical.

Immediately after creating the gaps, the stressor stripe portions relax laterally and induce tensile strain within the remaining portions of the germanium stripe. Subsequent refilling of the gaps, for example, with amorphous or polycrystalline germanium does not remove the tensile strain in the remaining portions of germanium stripe, but does largely remove the dielectric discontinuity in the waveguide or active region of the laser or photodetector between different portions of the germanium stripe along the length (or optical) axis of the device. This is illustrated schematically in FIG. 11, where amorphous or polycrystalline germanium 116, 118 is deposited within the gaps such as gap 108 between portions of the germanium stripe 102, 104. Refilling the gaps with a suitable material restores a continuous optical medium in the segmented germanium stripe of the laser or photodetector active region that has discontinuous tensile strain.

In certain embodiments of the tensile strained germanium laser diode or photodetector diode, the material 116, 118 that refills the gaps between segments of the germanium active region may be doped and used as an electrical conductor in the diode. In a preferred embodiment the refill material is n+ doped polycrystalline-SiGe and acts as the electron emitter in the laser diode, emitting electrons laterally into p-type doped strained germanium regions 102, 104. Doping polycrystalline germanium or silicon germanium n-type during deposition is well known and readily accomplished.

FIGS. 12-17 show various alternatives for forming an electrical junction for a system that includes desirably tensile strained germanium. The standard mode of operation of a semiconductor laser requires stimulated emission of photons to occur in an active region formed at the junction of two material regions, one region providing a source of holes and the other region a source of electrons such that radiative recombination of the holes and electrons occurs in the vicinity of the junction of the two regions. The two material regions are typically p-type and n-type semiconductor regions respectively and form a p-n junction where they meet. If a region that is neither strongly p-type nor strongly n-type is present between the n-type and p-type regions, the junction is referred to as a pin junction where the nominally undoped region is considered "intrinsic." In some implementations, an undoped layer or layers is provided between p-type and n-type layers to form the desired junction.

In the strained germanium laser, the region of efficient radiative recombination of carriers (electrons and holes) preferably coincides with the region of maximum biaxial tensile strain in the germanium. In preferred embodiments of the device the region of maximum current density through the p-n junction is to the greatest degree possible coincident with the region of maximum biaxial or uniaxial tensile strain in the germanium. The plane of the p-n or pin junction may be predominantly parallel to the wafer surface or may be predominantly perpendicular to the wafer surface. Given the difficulties in doping germanium n-type by activation of implanted donor species, it may be preferred that the n-type germanium region be formed in an n-type doped state either in the starting wafer (which may be bulk germanium or germanium-on-insulator) or in the epitaxial germanium layer as appropriate. The p-type germanium region may be formed by implantation and activation of an acceptor species such as boron or by epitaxial growth of a p-type germanium region on top of the n-type germanium. Alternatively the junction may be formed by epitaxial growth methods starting with a p-type germanium bulk wafer or germanium-on-insulator wafer and growing an n-type germanium layer to form an epitaxial junction.

The electron emitter may be formed of a material different from crystalline germanium. n+ doped regions are difficult to manufacture in germanium due to poor activation of implanted donors in germanium. A deposited electron emitter material may be preferred where the emitter material may be any of: n+ in situ doped amorphous or polycrystalline germanium; n+ in situ doped amorphous or polycrystalline silicon or amorphous or polycrystalline silicon germanium; a low work function metal with work function less than 4.3 electron Volts; or a low work function metal with an interfacial dielectric layer between the metal and the germanium, the dielectric layer being thin enough to allow an electron current to flow through it. In embodiments where the germanium layer is on an insulator such as buried oxide (BOX), the contact to the (typically p-type) germanium preferably is a separate contact.

In the embodiment of the strained germanium laser, diode or photodetector with embedded SiGe stressors, illustrated in FIG. 4 and in FIGS. 12-17, an epitaxial p-n or pin junction may be formed in the germanium before the SiGe stressor regions are formed. In this case the SiGe stressor regions may be undoped, doped p-type or doped n-type. Separate electrical contacts are made to the n-type and p-type regions of germanium.

Insulating silicon oxide regions may be formed self-aligned to the silicon germanium (SiGe) stressor regions by the following-described method. The desired pattern of a matrix of embedded regions is defined by lithography and dry (plasma) etching in a layer of silicon nitride which is deposited on the germanium. The germanium is etched where it is not covered by silicon nitride to create recesses in the germanium surface. The recesses are filled with epitaxial SiGe alloy by a method such as chemical vapor deposition (CVD). If the CVD epitaxial process is selective, SiGe is grown epitaxially only in the recesses and not on top of the silicon nitride. If the CVD process is non-selective, the SiGe is deposited over all exposed surfaces in which case a subsequent planarization process such as chemical-mechanical polishing (CMP) is used to remove SiGe from silicon nitride surfaces leaving SiGe only in the mask openings and within the recesses in the germanium structure. At this stage in the process with the silicon nitride mask still covering germanium surfaces, an oxidation process is applied such that exposed surfaces of recessed (embedded) SiGe are oxidized. This grows an insulating thin film of silicon oxide or silicon germanium oxide on top of and self-aligned to the SiGe regions. The silicon nitride is then removed using a selective wet etch and the top surfaces of the biaxially strained germanium elements are exposed. At the same time, removing the silicon nitride allows a more complete transfer of stress from the SiGe regions which are biaxially tensile strained in the plane of the wafer to the laterally adjacent germanium regions which also become biaxially tensile strained in the plane of the wafer.

Figure 12:
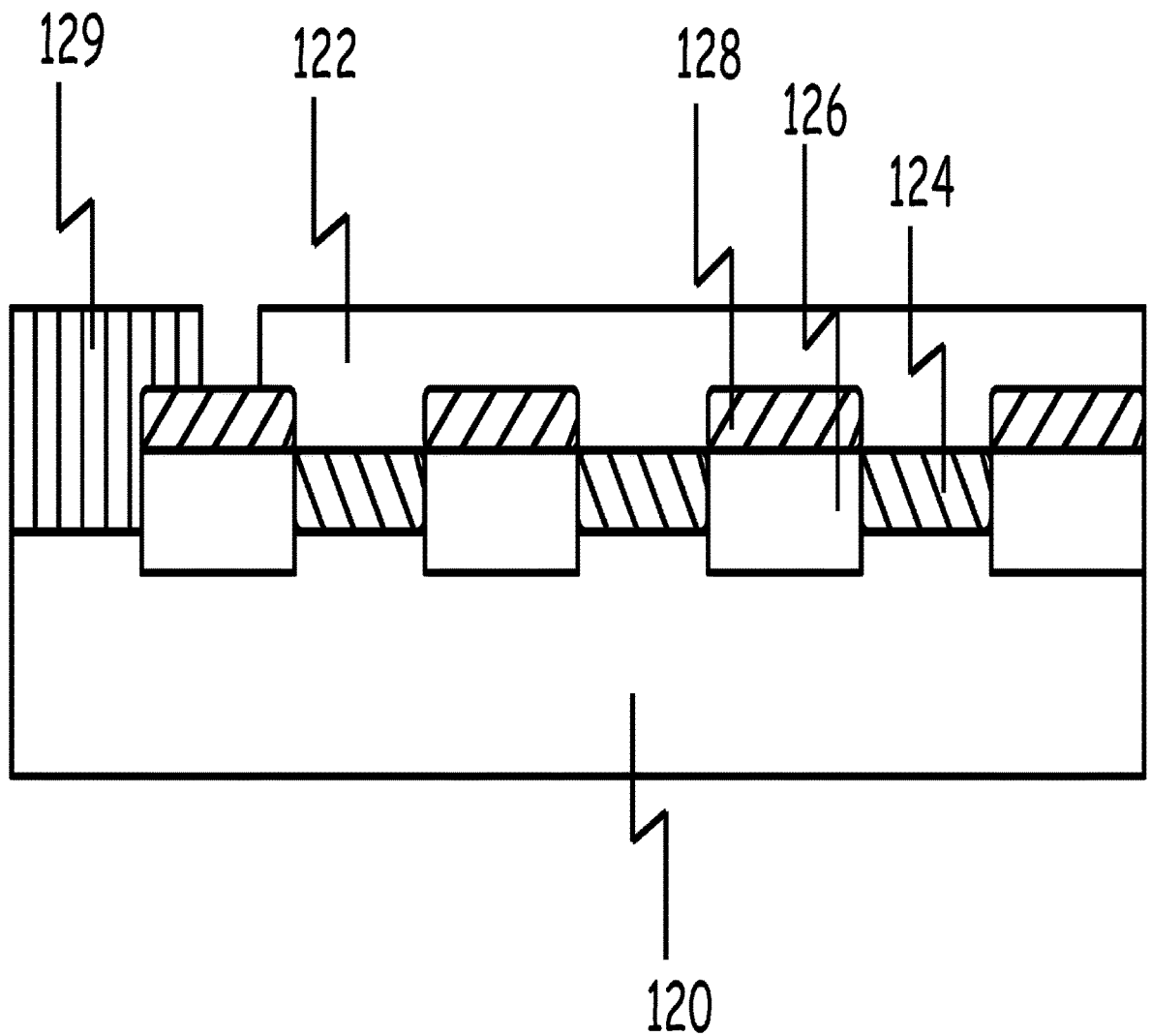
FIG. 12 schematically illustrates in cross section an array of tensile strained n-type germanium regions epitaxially deposited on a p-type germanium layer so that the structure can emit or detect photons.

FIG. 12 shows one implementation for forming a tensile strained germanium structure for a photon emitter or photon detector. For ease of discussion, this structure will be described with reference to a germanium diode laser utilizing in-plane biaxial tensile strain and, most preferably, a direct bandgap optical transition. Those of ordinary skill will understand that the present structure could be implemented as a simple light emitting diode rather than as a laser and that, with proper bias and amplifier, the illustrated structure could be used as a detector such as a photodiode. As discussed above, appropriate junctions include p-n junctions and p-i-n junctions. FIG. 12 starts as illustrated with a p-type germanium substrate 120, which might alternately be a p-type layer on an insulating layer such as a buried oxide (BOX) layer. Still further, the illustrated p-type germanium layer might be positioned on or over silicon including silicon circuitry or optical elements such as waveguides based on silicon or silicon oxide structures. These various possibilities for the germanium substrate are similar for the other implementations illustrated in FIGS. 12-18 and so are not repeated in the discussion of those illustrations.

The FIG. 12 implementation preferably forms a structure like that illustrated in FIG. 4 with the strain and optical properties discussed above with respect to FIG. 4. In the FIG. 12 implementation, a layer 124 of intrinsic or lightly doped n-type germanium is epitaxially deposited on the p-type germanium substrate 120, with the n-type doping preferably accomplished in situ during deposition. A mask, such as a silicon nitride mask, is formed over the intrinsic or lightly doped n-type epitaxial germanium layer, with openings in the mask defining a matrix pattern such as a checkerboard pattern above the intrinsic or lightly doped n-type epitaxial germanium layer 124. Dimensions of the regions can vary while achieving the desired tensile strain and might, for example, be generally square in top cross section and might be approximately 0.04 to 1.0 microns on a side. Etching through the germanium layer 124 and preferably into the p-type substrate 120 proceeds to form a corresponding array of openings or recesses in the germanium structure. Silicon germanium regions 126 preferably are formed epitaxially by selective chemical vapor deposition within the openings in the p-type germanium layer 120 and intrinsic or lightly doped n-type germanium layer 124 as defined by openings in the silicon nitride mask. In this illustration, the silicon germanium regions may be undoped or intrinsic. If the silicon germanium regions 126 are not deposited selectively or if otherwise preferred, chemical mechanical polishing may be performed to remove excess silicon germanium. Subsequently, the exposed silicon germanium preferably is oxidized by exposing the surfaces to an oxidizing environment to form the insulating silicon germanium oxide structures 128. Preferably, the silicon nitride mask layer is then removed.

As discussed above, formation of the silicon germanium regions adjacent and around the germanium regions creates biaxially tensile strained silicon germanium regions, which in turn, induce in-plane biaxial tensile strain in the germanium regions 124. Preferably the biaxial tensile strain is sufficient to cause these portions of the germanium regions to be direct bandgap so that they can be pumped and efficiently produce optical output. These biaxially tensile strained germanium regions 124 can then be used as components of a laser gain region. The silicon germanium regions 126 consequently are also within the laser gain region and do not contribute to the generation of optical output. Contacts are formed to the intrinsic or lightly doped n-type germanium regions. For example, a layer 122 of n-type doped amorphous or polycrystalline silicon germanium or n-type doped germanium could be provided to form a contact to the n-type germanium regions 124. Similarly, a region 129 of p-type doped amorphous or polycrystalline silicon germanium can be provided to form a contact to the substrate or base p-type germanium region 120 or other methods such as metal plugs can be used. Further processing preferably is performed to provide mirrors that define a resonator or laser cavity encompassing at least a portion of the strained germanium so that the biaxially tensile strained germanium regions can provide laser action.

Figure 13:
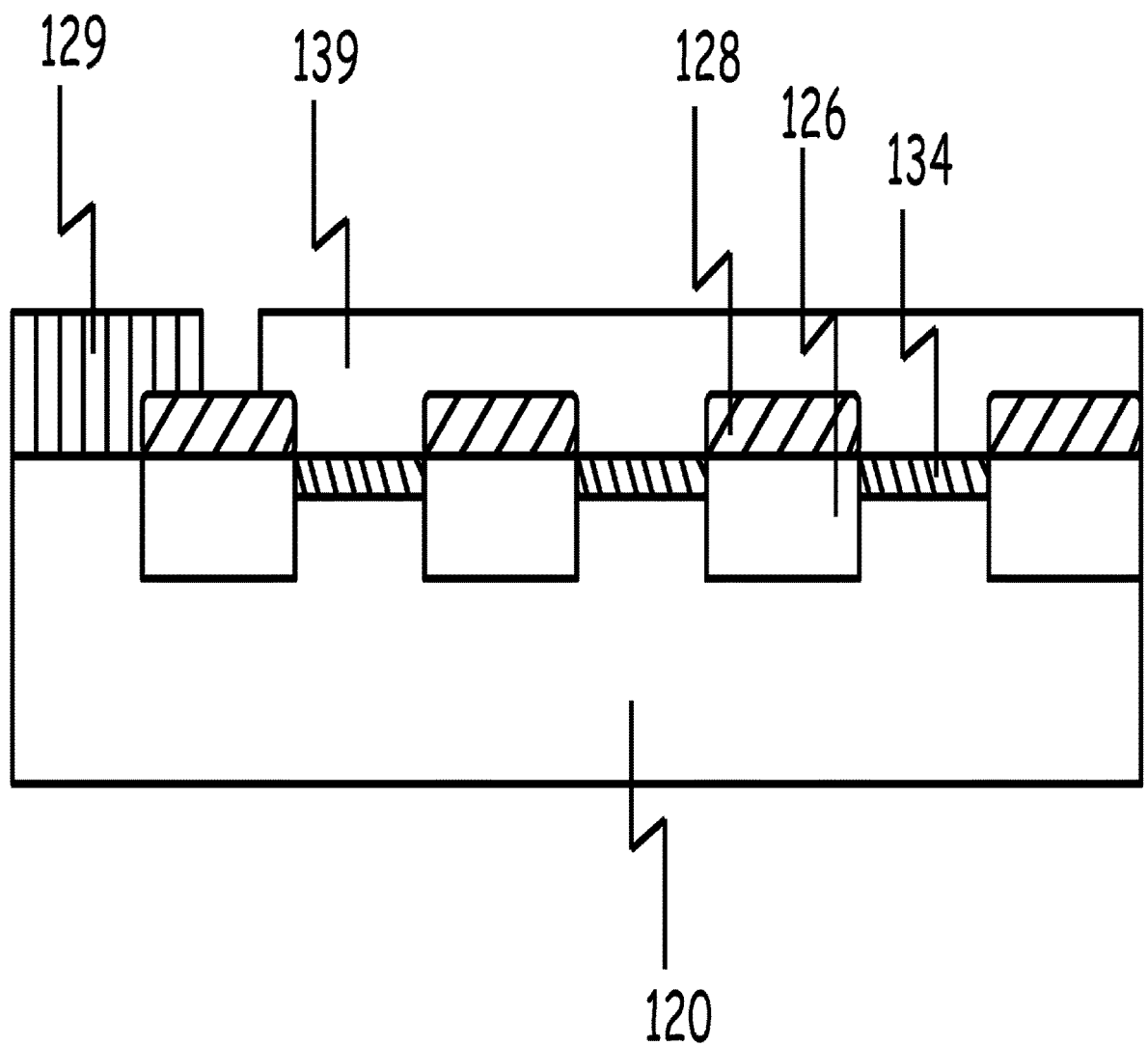
FIG. 13 schematically illustrates in cross section an array of shallow tensile strained n-type germanium regions doped by diffusion from an overlying layer of doped polysilicon.

FIG. 13 illustrates a different process for providing a structure generally like that illustrated in FIGS. 4 and 12. Like structures are indicated with the same numbers in FIG. 13 as are used in FIG. 12. Here, the process begins with a p-type germanium substrate or layer 120, which is patterned and etched by forming a silicon nitride mask with a matrix of openings followed by dry (plasma) etching to form recesses. Silicon germanium regions 126 are grown, preferably by selective chemical vapor deposition, to form in-plane tensile strained regions with remaining portions of the germanium substrate 120 extending up between the silicon germanium regions 126. The portions of the germanium substrate 120 underlying the silicon germanium regions are compressively strained in-plane. The exposed surfaces of the silicon germanium regions 126 are oxidized and then the silicon nitride mask is removed. Strongly n-type doped amorphous, polycrystalline or crystalline silicon or silicon germanium or germanium is deposited and patterned appropriately to form the layer structure 139 illustrated in FIG. 13. Doped layer 139 is in contact with the surface of the germanium layer 120 in the defined matrix pattern between the silicon germanium regions 126. The oxidized silicon germanium layers 128 separate the silicon germanium regions 126 from the doped layer 139 so that the dopants from the doped layer 139 do not diffuse into the silicon germanium regions 126. The structure is heated, for example by rapid thermal annealing, to diffuse n-type dopants from the strongly n-type doped layer 139 into the surface of the germanium 120 to form shallow n-type regions 134 in a matrix pattern, also forming junctions in that same matrix pattern. The resulting structure can be incorporated in a diode, laser or detector as described above. In addition, the resulting structure will have a strain distribution and therefore will be able to generate broad band emission. For laser applications, mirrors can be used to select the desired wavelength from that broad band emission, advantageously providing a range of possible gain and output wavelengths. For detectors or diodes, filters can be formed adjacent the emission or detection regions to select emission or detection wavelengths.

Figure 14:
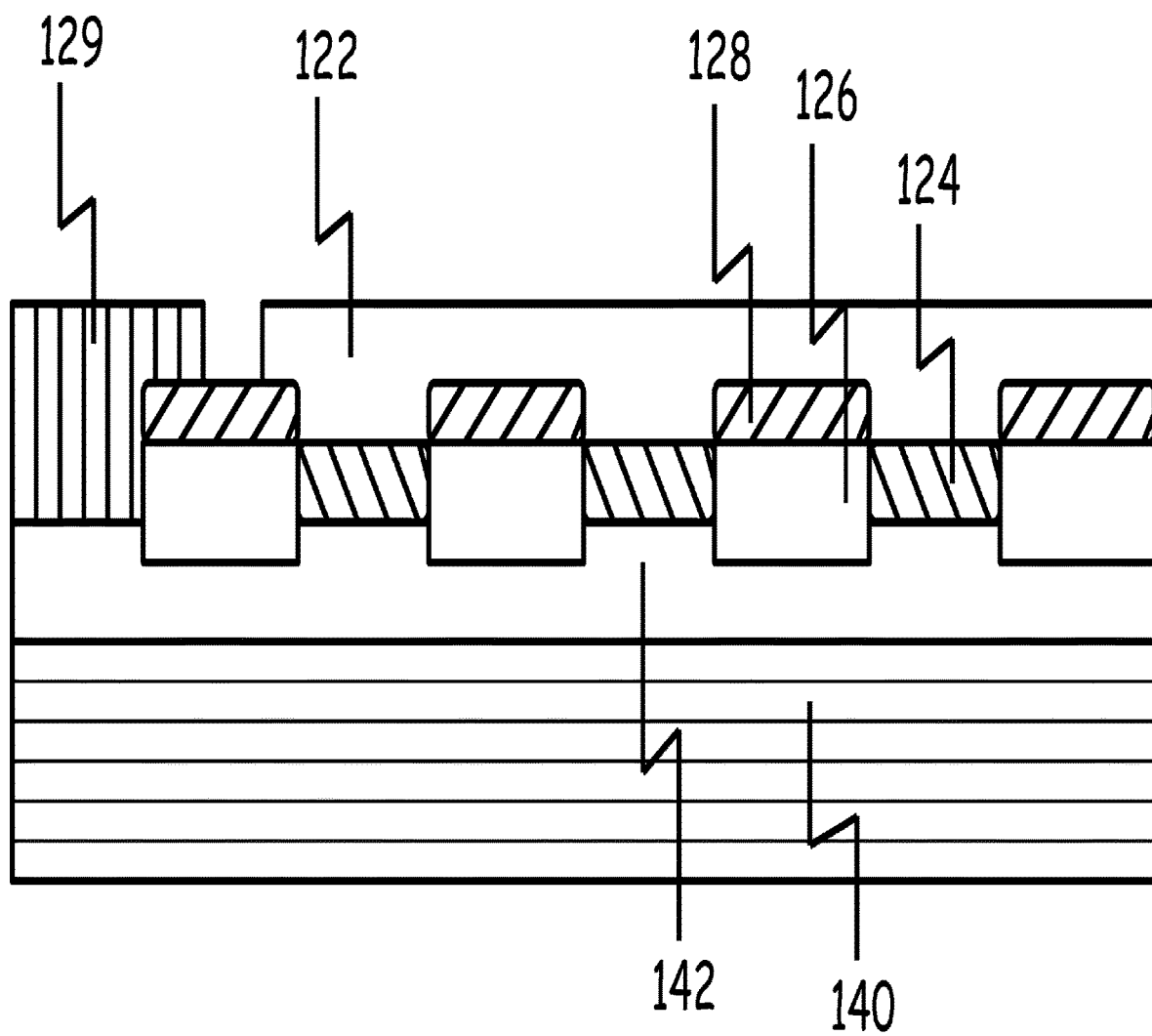
FIG. 14 schematically illustrates in cross section an array of epitaxial tensile strained n-type germanium regions formed on an array of epitaxial p-type germanium regions so that the structure can emit or detect photons.

FIG. 14 illustrates another variation on the tensile strained germanium structure that can be used for emitting or detecting photons. The FIG. 14 structure and processes are similar to those illustrated and described with respect to FIG. 12 and so the detailed description is not repeated. Structures that are substantially similar between the FIGS. 12 and 14 are identified by the same reference numbers. The FIG. 14 structure is formed on a highly p-type doped germanium substrate 140. A layer of epitaxial p-type doped germanium 142 is deposited on the more heavily doped p-type germanium substrate. Subsequent processing follows, for example, as described above with respect to FIG. 12. The resulting FIG. 14 structure has properties similar to the structure of FIG. 12 but with a more conductive p-type substrate so that there is less series resistance and the photon emission and detection device is generally more efficient.

Figure 15:
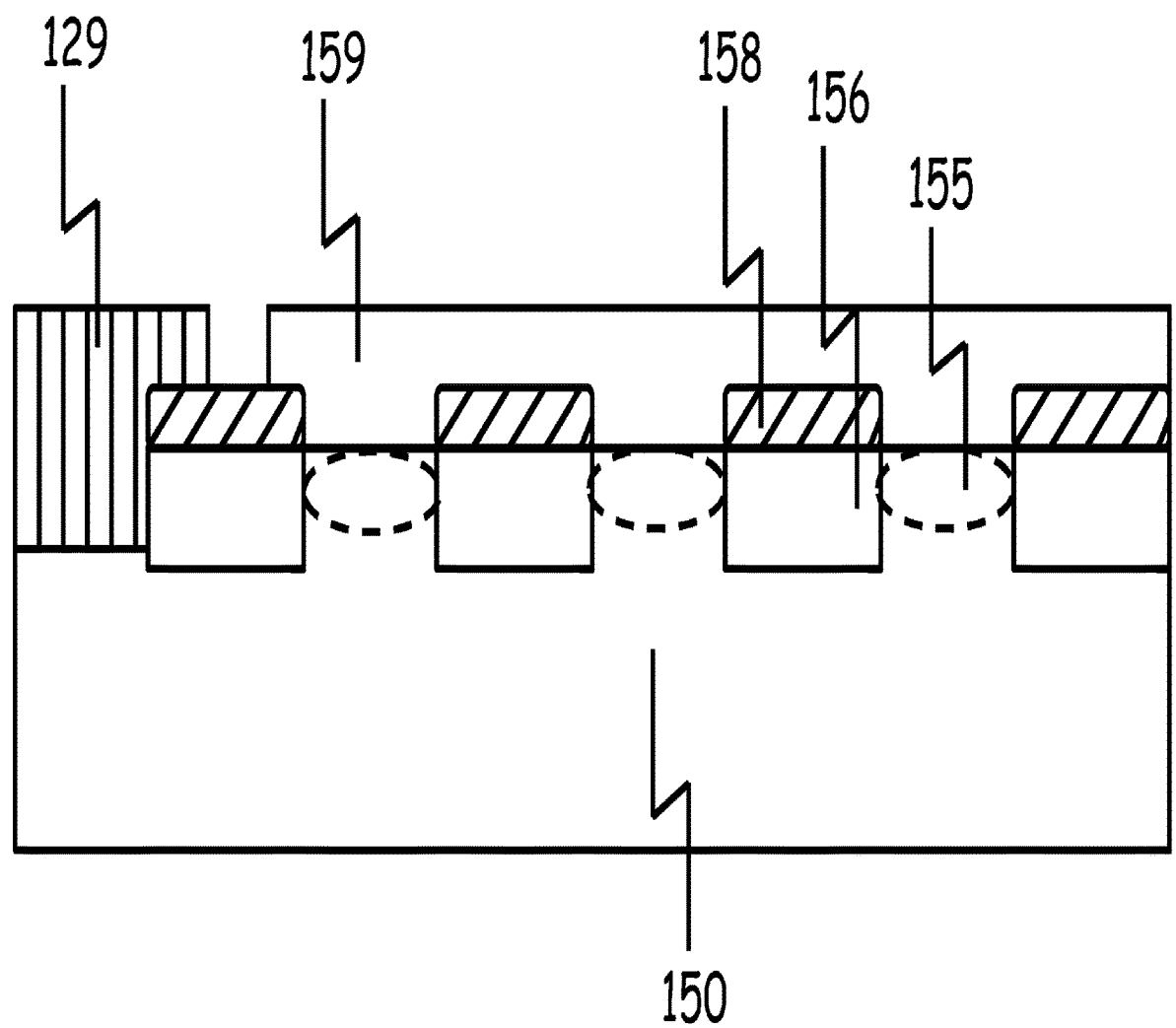
FIG. 15 schematically illustrates in cross section an array of tensile strained p-type germanium regions in contact with an electron emitter layer so that the structure can emit or detect photons.

FIG. 15 shows another implementation of the FIG. 4 in-plane biaxially tensile strained germanium structure. The substrate 150 is p-type germanium that is patterned with a silicon nitride or other mask to define a matrix of stressor positions. Etching into the p-type germanium substrate 150 forms a matrix of recesses in which silicon germanium is deposited epitaxially, preferably using selective chemical vapor deposition, forming biaxially tensile strained silicon germanium 156. The silicon germanium regions 156 are oxidized to form silicon germanium oxide regions 158. Surface portions 155 of the p-type germanium substrate are consequently biaxially tensile strained through the force applied from the surrounding silicon germanium regions 156, in the manner discussed above. Removing the silicon nitride mask allows for more complete strain transfer. In the FIG. 15 process, an electron emitter material 159 is deposited and patterned as illustrated. A deposited electron emitter material may be preferred to provide more conductivity or more design flexibility. Appropriate emitter material may be any of: n+ in situ doped amorphous or polycrystalline germanium; n+ in situ doped amorphous or polycrystalline silicon or amorphous or polycrystalline silicon germanium; a low work function metal; or a low work function metal with an interfacial dielectric layer that is thin enough to be electrically conductive between the metal and the germanium.

In the FIG. 15 configuration, the preferred radiative recombination for an emitter such as a laser occurs primarily in the upper, biaxially tensile strained portions 155 of the p-type germanium substrate.

Figure 16:
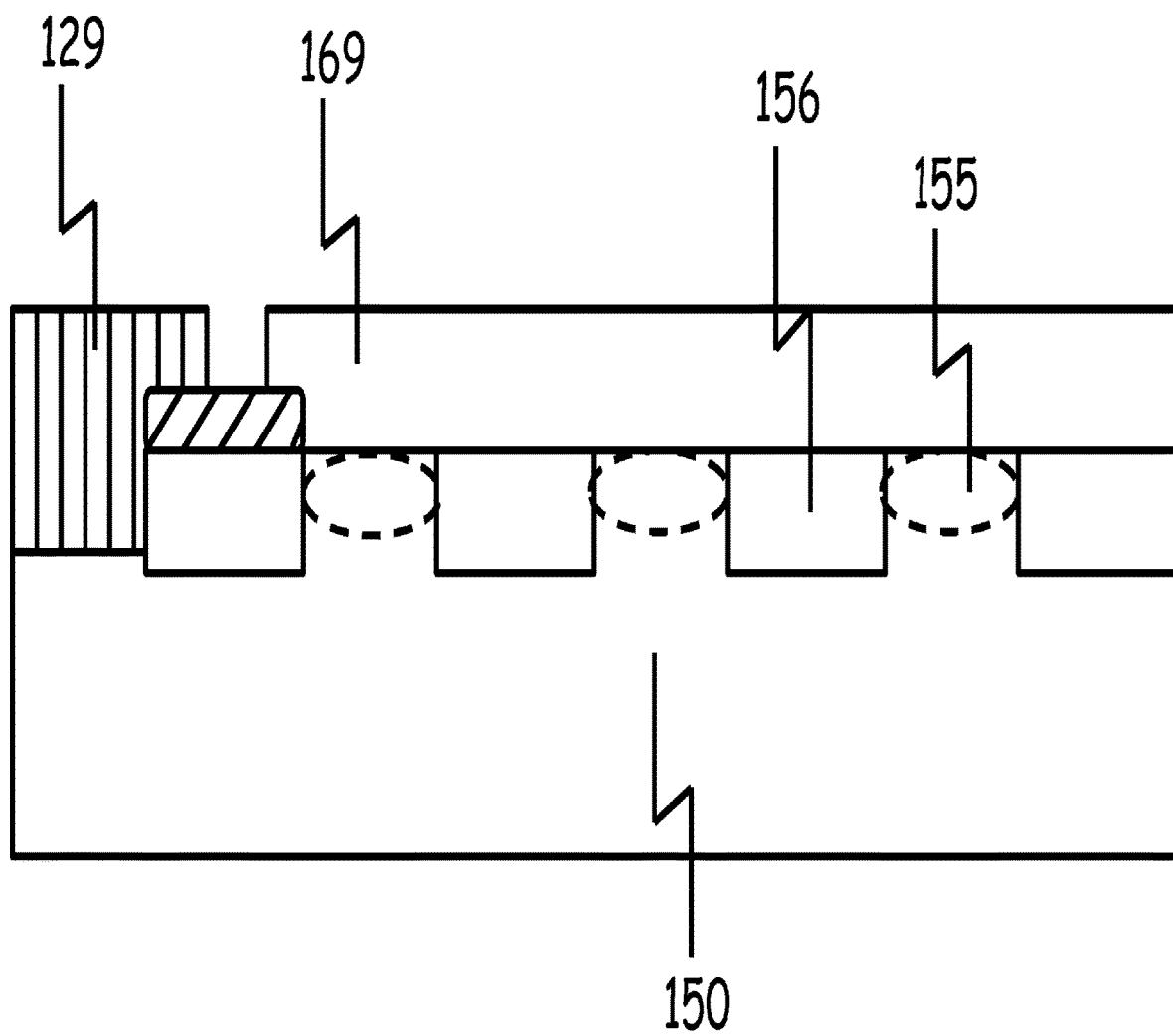
FIG. 16 schematically illustrates in cross section an array of tensile strained p-type germanium regions in contact with an electron emitter layer so that the structure can emit or detect photons.

FIG. 16 shows a modification of the FIG. 15 configuration, in which oxide regions are not formed over the silicon germanium regions 156 and the electron emitter layer 169 is formed in direct contact with the silicon germanium regions 156. Other aspects of the FIG. 16 configuration are the same as those discussed above with respect to FIG. 15 and its process.

Figure 17:
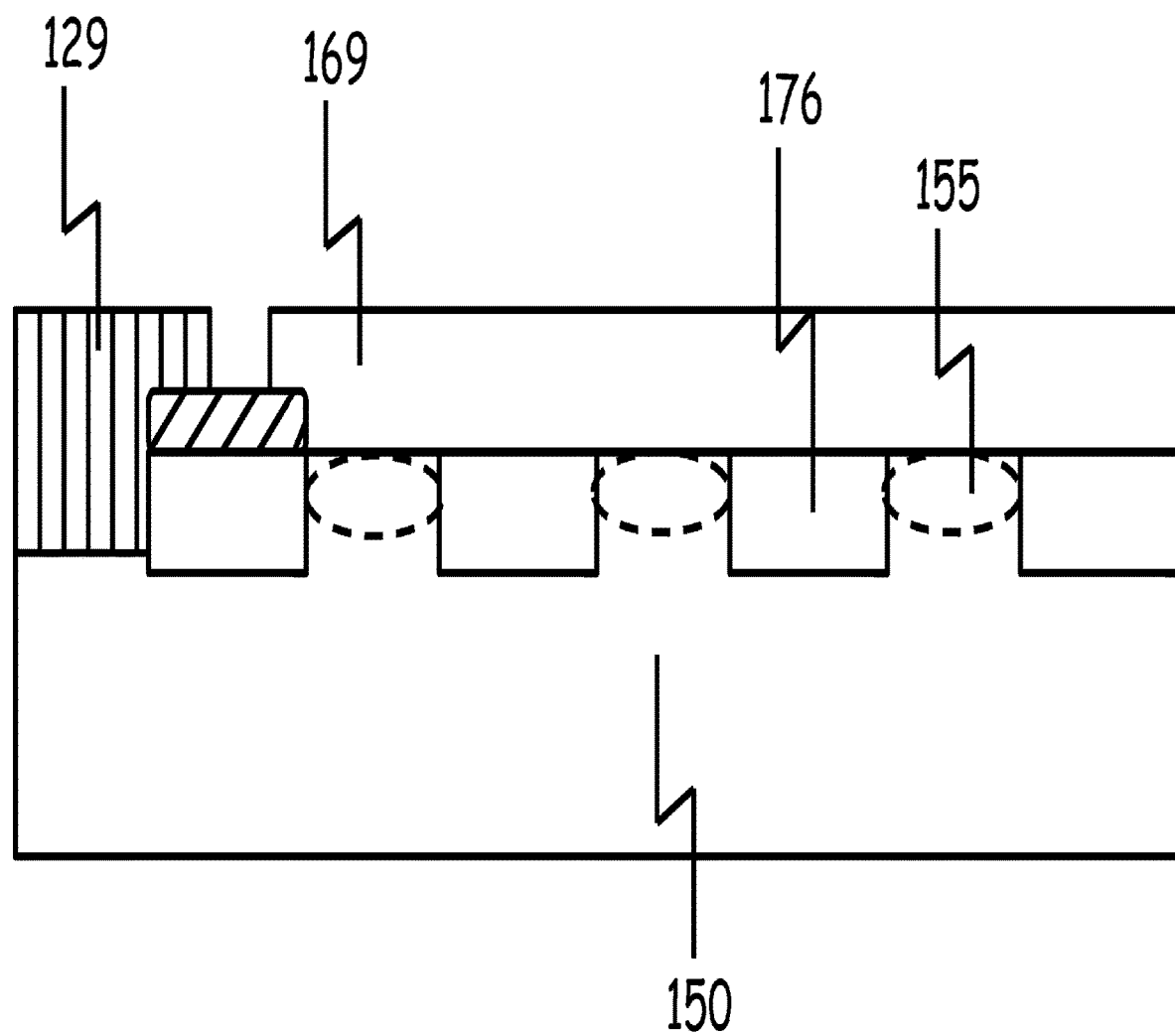
FIG. 17 illustrates in schematic cross section an array of tensile strained p-type germanium regions in lateral contact with n-type silicon germanium regions and an electron emitter layer so that the structure can emit or detect photons.

FIG. 17 provides a further modification of the FIG. 16 structure in which the silicon germanium regions 176 are doped during deposition so that the silicon germanium regions 176 are n-type. In this configuration, electrons can be injected from the electron emitter layer 169 above the tensile strained germanium regions 155 and laterally from silicon germanium regions 176 around the regions 155. The n-type silicon germanium regions 176 increase the electron emission into the radiative recombination regions, particularly into the higher strain regions of the strained germanium regions 155 and thereby increase the efficiency of the photon emission process. For detector implementations, the structure illustrated in FIG. 17 provides more junction area to collect photon-generated electron hole pairs, providing a more efficient detector structure. The structures illustrated in FIGS. 12-17 allow for photon emission and detection using similar structures, making it generally simpler to construct emitters such as diodes or lasers as well as detectors such as photodiodes on the same substrate (wafer) using at least some common process steps.

Preferred embodiments of the illustrations of FIGS. 4 and 12-17 position four silicon germanium embedded stressor regions around an in-plane biaxially strained germanium region. In an array including a number of biaxially strained germanium regions according to such embodiments, embedded silicon germanium regions can be adjacent to multiple germanium regions. The tensile strained silicon germanium regions on at least two sides and preferably four sides of the germanium region preferably induce biaxial strain in the germanium region. In some implementations, the silicon germanium regions are not substantially connected to adjacent (nearest neighbor) silicon germanium regions. The silicon germanium stressor regions may have a square, rectangular, rounded or circular lateral cross section. In particularly preferred implementations of these (non-continuous stressor) embodiments, the width (or equivalently, length) of each lateral dimension of the germanium region between opposed embedded silicon germanium stressor regions is less than 400 nanometers and, more preferably, less than 100 nanometers. Preferably, the tensile silicon germanium regions have a silicon composition of between 20% and 100% silicon and, more preferably, between 40% silicon and 60% silicon. The preferred embodiments of the present invention are implemented with a substantially 100% germanium region (which, given the deposition environments, may include silicon to a measurable extent), but it should be understood that the germanium regions could be implemented in a future implementation with some extent of silicon or carbon and be within the teachings of the present invention.

Figure 18:
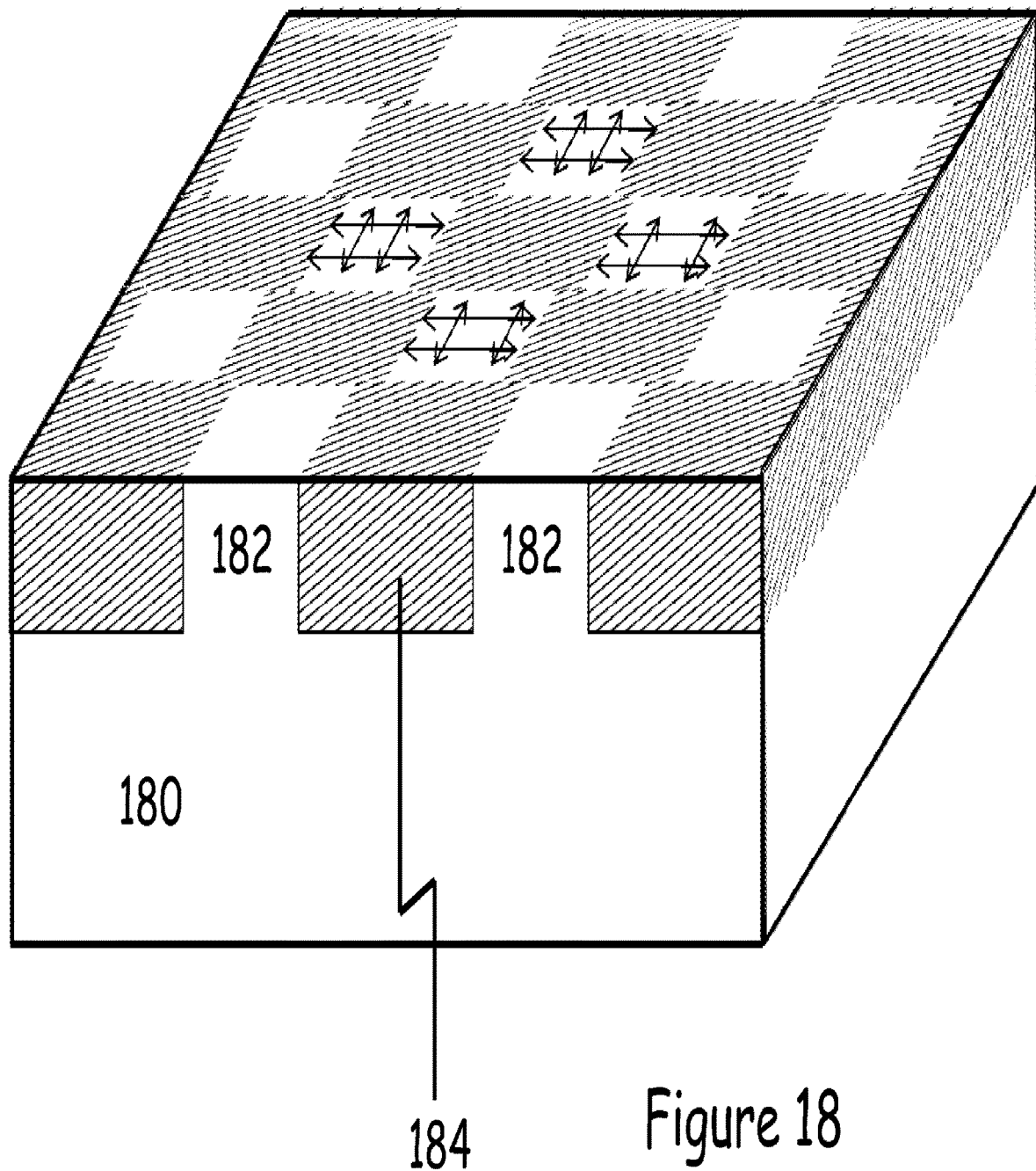
FIG. 18 illustrates another strategy, consistent with the structures and processes illustrated in FIGS. 12-17, in which one or more discrete germanium pillars are formed and embedded within a continuous silicon germanium stressor.

FIG. 18 illustrates a preferred embodiment of the structures and processes illustrated in FIGS. 12-17, in which one or more discrete germanium pillars are formed and embedded within a subsequently deposited silicon germanium stressor layer. In general, the FIG. 18 structure is formed on a germanium substrate by providing a mask through lithography or any other patterning method to define the locations and extent of isolated germanium pillars. Patterning and etching defines the lateral extent of the germanium pillars. Etching depth defines pillar height. Pillars are isolated in the lateral sense but are preferably not isolated from the underlying germanium substrate so that adjacent pillars share a common germanium region or substrate. The pillars might, for example, have a height above the remaining germanium region or substrate of between about 20 nanometers and 400 nanometers or, more preferably, between about 40 nanometers and 100 nanometers. The germanium pillars may have a square, rectangular, rounded or circular lateral cross section and preferably have a lateral dimension of more than 20 nanometers and less than 200 nanometers and, more preferably, have a lateral dimension of between 30 nanometers and 100 nanometers. Preferably the germanium pillars are formed in a regular array such as a "checkerboard" pattern in which the pillars are spaced apart by uniform x and y separations.

After forming the array of germanium pillars, manufacture of the FIG. 18 structure proceeds by depositing a layer of silicon germanium around the pillars. The silicon germanium is deposited on the surface of the germanium substrate so that the silicon germanium will be in a tensile strained state. Preferably, the tensile strained silicon germanium layer has a silicon composition of between 20% and 100% silicon and, more preferably, between about 40% silicon and 60% silicon. As discussed above with respect to FIGS. 12-17, the silicon germanium deposition process may be done selectively or may be performed and then excess silicon germanium can be removed through, for example, chemical mechanical polishing. As is also described above, the tensile strained silicon germanium layer induces lateral, biaxial tensile stress within the germanium pillars, preferably to an extent to cause the direct optical transition to be the lowest band gap of the biaxially strained germanium pillars. The more specific manufacturing and structural strategies illustrated in and described with respect to FIGS. 12-17 can be implemented in the geometry and arrangement of germanium pillars illustrated in FIG. 18. In FIG. 18, which represents a part of the active region of a strained germanium laser according to one embodiment of the invention, multiple pillar regions 182 are formed in a patterned array by etching into germanium layer 180 and filling the etched trenches with a tensile stressed material such as epitaxial silicon germanium as represented by region 184. In the particular example represented here, the trenches surrounding each germanium pillar are deliberately merged such that the tensile stressed trench fill material forms one continuous region 184.

It is, of course, also possible to combine the overlying stressor layer (e.g., in plane biaxially compressively stressed silicon nitride) with embedded stressors (e.g., in plane biaxially tensile stressed silicon germanium) to biaxially tensile strained germanium. Preferably the overlying stressor layer has openings where the embedded stressors are formed so that it covers the germanium regions to be strained. Also preferably the overlying stressor is removed after the strained germanium is formed.

The invention provides the possibility, in a further refinement, to intentionally position the optically active, highly emitting strained germanium pillars or fins (for example regions 182 in FIG. 18) at specifically determined locations along the principal optical axis of the laser resonant cavity corresponding to a spacing equal to one half wavelength of the resonant optical mode of the cavity. That is, one or several rows of optically active germanium elements may be preferentially spaced at intervals of one half wavelength of the desired optical mode of the laser cavity. This allows an optimization of light amplification in the cavity and minimization of reabsorption (optical loss) by eliminating (avoiding) strained germanium regions at locations that do not contribute to light amplification and that would otherwise only add to electrical and optical energy losses.

Fabrication of light emitting diodes or lasers or photodetectors in a body of tensile strained semiconductor (e.g., germanium) enables a whole photonics system including light emitters, optical couplers, waveguides and photodetectors to be combined and integrated within the same layer of semiconductor (e.g., germanium). Where light emission or detection is required the semiconductor is differentiated by locally tensile straining the semiconductor (e.g., germanium), the straining causing the optical semiconductor (e.g., germanium) band gap to be narrowed and the semiconductor's band gap to become more direct. Where light emission or detection is not required the semiconductor is not intentionally tensile strained and the band gap remains wide and indirect. Examples of optical components in which light emission or detection is not required include waveguides and optical couplers, and preferably the semiconductor (e.g., germanium) regions corresponding to such circuit components are not intentionally strained. In a preferred embodiment the semiconductor is germanium and the germanium is locally biaxially tensile strained in locations where an active optoelectronic device such as a laser, light emitting diode or photodetector is fabricated. In a preferred embodiment the biaxial tensile strain is equal to or greater than about 2% in a sufficient proportion of the germanium region within an active optoelectronic device to achieve the desired active optoelectronic device functionality, be it photon emission or photon detection. Active optoelectronic device regions preferably are differentiated from passive optoelectronic device regions primarily by the degree of tensile strain and less so by a difference in the elemental composition of the active material. Conventional photonic integrated circuits solely or primarily use changes in elemental composition to differentiate active from passive optoelectronic devices.

In an example of a conventional indium phosphide based photonic integrated circuit, the passive waveguide is a layer of indium phosphide and the active components include an active layer comprising indium gallium arsenide or indium gallium arsenide-indium phosphide multiple quantum wells. Light is emitted by the indium gallium arsenide which is an optically active, direct band gap semiconductor material as a result of its chemical composition, not as a result of strain within the material. Here the light is emitted by a material that is not the same material as the waveguide material. In general, the light emitting material is added to the waveguide material by epitaxial growth or by a bonding method wherever a laser is fabricated. Preferred aspects of the present invention facilitate use of the same material as an emitter or detector and as the waveguide by altering the material's optical properties at least in part by imposing a strain.

In general, assembling optical networks consisting of light emitters, modulators, waveguides, and detectors together requires alignment of the components in three dimensions and at angles to a very high degree of control and precision. A typical figure of merit in aligning the optical axis of a waveguide with that of a detector is to obtain at least 50 to 80% of transmission, which for Gaussian beam profiles requires an alignment of better than approximately 10% of the cross section dimension of the waveguide, which is on the order of 0.1 um. This is typically done with a lot of effort, using active or passive alignment strategies. As a result, yield and cost issues make optical networking components much more expensive than semiconductor integrated circuits. There are large and ongoing efforts to find cost-effective, integrated assembly solutions. Aspects of the present invention can be used to limit assembly and alignment issues. A typical process flow to build optical aspects of a system implementing aspects of this invention draws from steps already used in the manufacture of integrated circuits. Using such existing technology offers the possibility that well-established methods for yield improvement and cost reduction can be applied to optical interconnect, communication or other systems.

Manufacturing an integrated optical (photonics) system in a single semiconductor layer draws from established front-end line processes currently used in leading-edge microelectronics manufacturing: wet cleans, epitaxy of group IV elements (silicon, germanium or their alloy), deposition of dielectric films, patterning by way of lithography and subtraction of material through suitable wet and dry etches, followed by CMP, and miscellaneous steps to dope and make electrical contact to the electrical components of the optical system. Bonding, hetero-epitaxy of IIIN or IINI compound semiconductors or depositing non-group IV materials, be they crystalline or non-crystalline, may supplement aspects of the optical systems described here, but are not essential to achieve integrated photonic systems. A preferred method for fabricating an integrated photonic system on a semiconductor wafer may require little alignment of optical components other than self alignment.

In a preferred embodiment the invention provides an optical system in which at least some and in particularly preferred implementations all components including emitter, waveguide, and detector are made from substantially the same element (e.g., germanium) where the material is strained locally and selectively in such a way that it becomes optically active with a band structure that corresponds to the band structure of a direct gap semiconductor only where required by the system designer, i.e., within the gain medium of lasers, within light emitting diodes or within photodetectors. Preferably, a waveguide defined in part laterally by low dielectric constant materials, an emitter such as a laser having a gain region including one or more biaxially strained germanium regions, and a detector such as a photodiode comprising one or more biaxially strained germanium regions, with the waveguide, active regions of the emitter and the detector self-aligned to one another.

Figure 19:
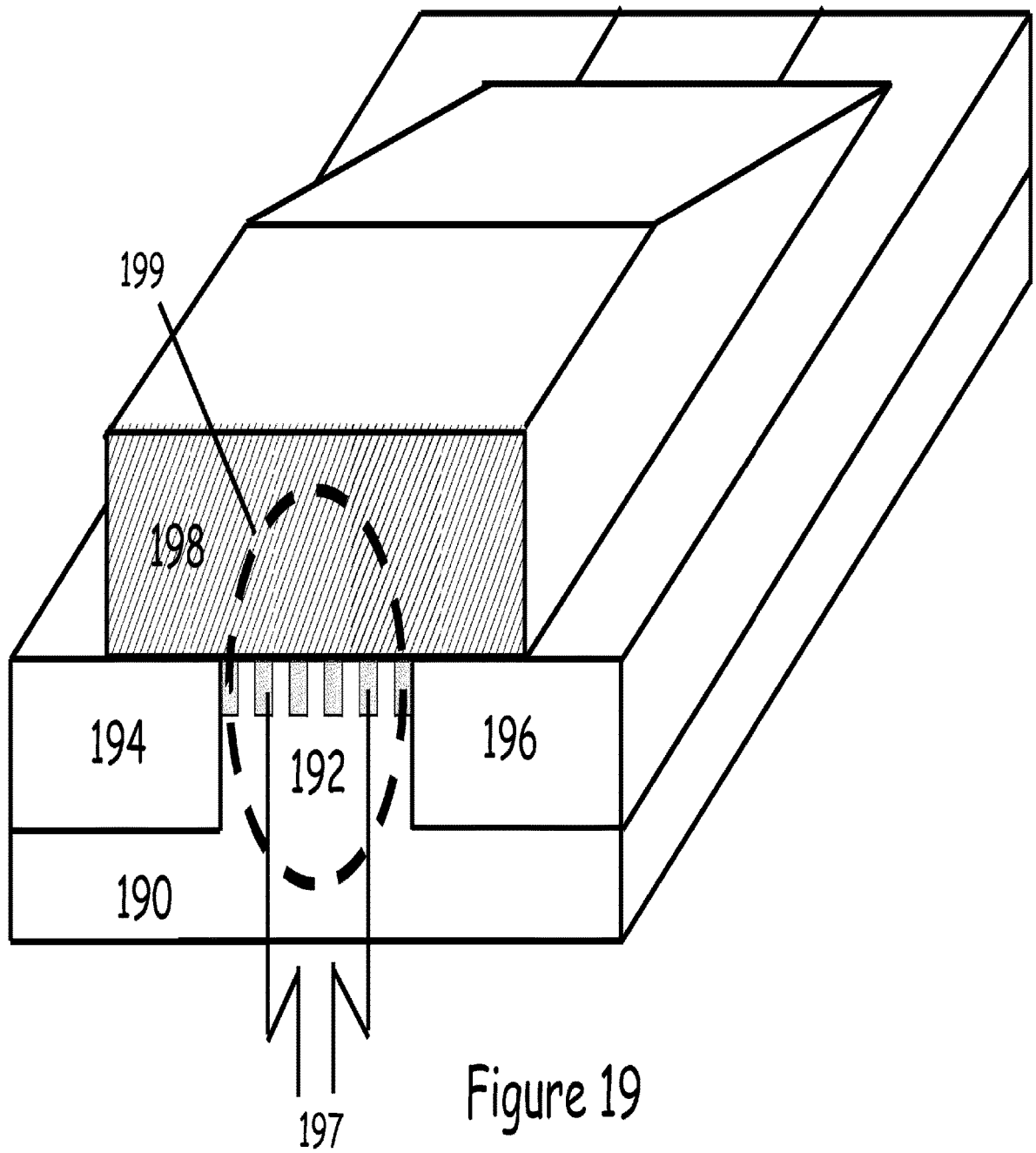
FIG. 19 schematically illustrates a germanium waveguide coupled with a structure having in-plane strained or biaxially strained germanium pillars or fins that emit or detect light.

In the embodiments depicted in FIGS. 12-17, as previously discussed, the emitter layer overlying the strained germanium regions may be doped amorphous or polycrystalline germanium or silicon or silicon germanium alloy. In such embodiments it is advantageous to select a thickness and cross-sectional geometry for the emitter layer such that the light intensity profile (mode field pattern) is contained partially in the germanium layer and partially in the emitter layer with the aim of maximizing the overlap of the light intensity profile and the volume of optically active biaxially strained germanium pillar or fin regions. The biaxially strained regions of germanium may be in the upper part of the germanium waveguide structure. Those of ordinary skill in the art can design the overall structure to position the optical mode with the maximum optical intensity coincident with the most highly strained regions of germanium. By this means the light amplification by stimulated emission in the strained germanium regions is optimized. This preferred embodiment is represented in FIG. 19 where the laser is formed in a rib waveguide 192 that is etched into a germanium layer 190. The rib is clad on adjacent sides by regions of low index dielectric material such as silicon oxide, 194 and 196. Silicon germanium tensile stressor regions are indicated as 197 and the columns of germanium between the silicon germanium stressors are biaxially strained and optically active providing radiative recombination and stimulated emission of light. Emitter region 198 is formed over the lasing region of the germanium rib in a pattern that is optionally overlapping onto the low index regions 194 and 196. Within the body of the laser the optical intensity profile is preferably centered on the highly biaxially strained regions of the germanium pillars within the rib as indicated by the dashed line 199 which represents the mode field pattern within the germanium laser. In a further refinement the emitter region 198 is beveled or tapered down in thickness along the axis of the germanium rib in the direction leading away from the lasing region such that the optical intensity profile (mode field pattern) is repositioned back into the body of the germanium rib waveguide. In this case, the polycrystalline emitter material does not overlie the germanium waveguide except where an optically active device such as a laser or photodetector exists.

It will be appreciated that the structure illustrated in FIG. 19 can accommodate the other emitter structures illustrated in FIGS. 4 and 12-17 within the general region indicated as 199 in FIG. 19 and with similar operation and advantage. Also, the structure generally illustrated in FIG. 19 can also be used to provide a detector. Optical signals are generated in an emitter or laser region 199 and propagate through the wedge structure and into the rib waveguide 192. These optical signals may be generated by a driver circuit in a silicon processor or memory circuit as part of an electrical to optical bus transaction so that the optical signals carry data from a processor or memory circuit. The optical signals propagate through the rib waveguide 192 to a near or remote detector location where the optical signals can be converted to electrical signals for further processing in a processor, storage in a memory or other desired process. A detector may be coupled to a rib waveguide through a wedge such as the wedge 198 illustrated in FIG. 19 and into a region with fins or pillars of biaxially tensile strained germanium configured as a detector as illustrated in FIGS. 4 and 12-17 and as discussed above. Preferably, active regions of each of the emitter an detector are self-aligned with the rib waveguide and with each other.

Circuitry within a processor can be coupled to circuitry in a spaced apart or remote portion of the processor by providing an optical plane such as a layer of germanium. Driver circuitry in the processor outputs a set of data in parallel to a matched array of emitters such as lasers. The lasers might each have the configuration as illustrated in FIG. 19 and produce optical outputs modulated with the output of the driver circuitry that is coupled into a corresponding array of rib waveguides. Signals transmitted in parallel through the corresponding array of rib waveguides are provided to a corresponding array of detectors having biaxially tensile strained germanium fins or pillars as discussed above. The outputs of the array of detectors are provided to driver circuits which provide the retrieved signal to an electrical bus that distributes the signals within the processor.

Figure 20:
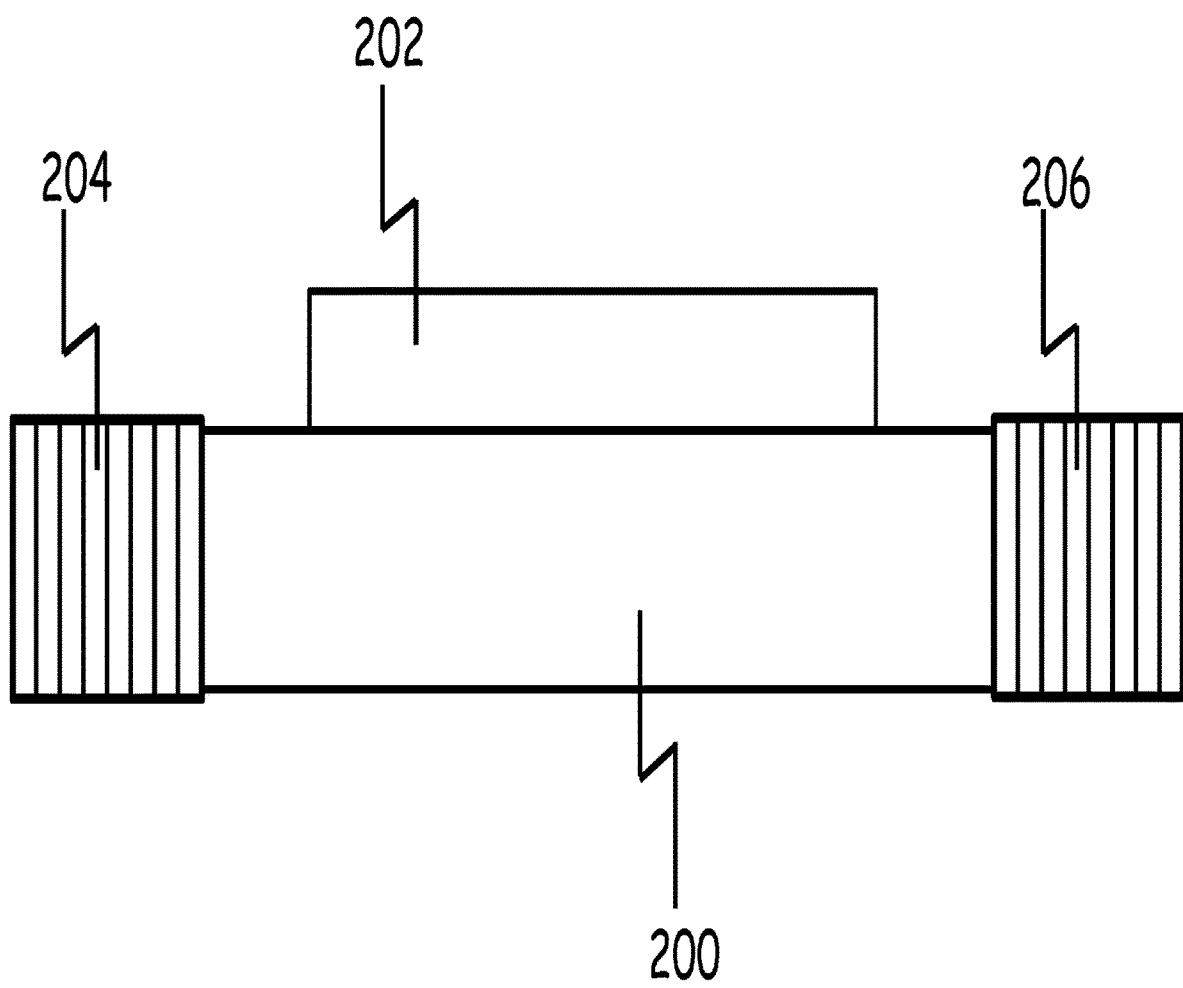
FIG. 20 illustrates schematically a configuration in which a layer containing tensile strained germanium is coupled with a resonator to provide a laser structure.

FIG. 20 shows another configuration for a laser incorporating one of the strained germanium gain structures discussed above. As illustrated, a strained germanium structure 202 such as any of those discussed above that preferably has sufficiently tensile strained germanium present through at least a portion of the structure 202 is provided in contact with an optical structure 200. For example, the optical structure 200 may be a waveguide or an optical cavity for a laser with mirrors 204, 206 formed on opposite surfaces of the optical structure 200. The optical structure might, for example, be a silicon waveguide, a silicon oxide waveguide or other appropriate structure for a laser cavity. The mirrors 204, 206 on either end of the optical structure, for example, might be distributed Bragg reflectors, the structure and manufacture of which are well known. In the illustrated configuration, one of more laser modes can couple into the strained germanium portions of the structure 202 to be amplified by the gain of the region. The coupling between structures 200 and 202 may, for example, be evanescent coupling. Preferably sufficient gain is achieved to provide gain to the laser cavity through modes coupling to the adjacent gain medium. Other configurations for the laser structure can be used, including those that have mirrors formed directly on the strained germanium structure. Various mirrors, including reflective or partially reflective surfaces can be used, as is known in the art. A similar strategy can be used to provide evanescent coupling between a waveguide and a photodiode structure as illustrated and discussed above to provide an effective detector for guided optical signals.

The present invention has been described in terms of certain preferred embodiments. Those of ordinary skill in the art will appreciate that various modifications and alterations could be made to the specific preferred embodiments described here without varying from the teachings of the present invention. Consequently, the present invention is not intended to be limited to the specific preferred embodiments described here but instead the present invention is to be defined by the appended claims.

What is claimed is:

1. A method of making an optical device, comprising: providing a substrate having a layer that includes germanium; etching openings into the layer that includes germanium; and forming silicon germanium within the openings to form a pattern of embedded silicon germanium regions surrounding at least one portion of the layer that includes germanium, and the at least one portion of the layer that includes germanium having in-plane biaxial tensile strain.

2. The method of claim 1, wherein the layer that includes germanium is separated from another portion of the substrate by an insulating layer and the openings extend only partially through an entire thickness of the layer including germanium.

3. The method of claim 2, wherein the method forms a plurality of portions of the layer that includes germanium, each of said portions having biaxial tensile strain.

4. The method of claim 3, wherein biaxial tensile strain within the plurality of portions of the layer that includes germanium is sufficient in at least parts of said portions to provide a direct bandgap.

5. The method of claim 4, further comprising forming a laser cavity so that light amplified within the laser cavity passes through more than one of the plurality of portions of the layer that includes germanium.

6. The method of claim 2, wherein tensile strain within the at least one portion of the layer that includes germanium is sufficient in at least a part of the at least one portion to provide a direct bandgap.

7. The method of claim 6, further comprising forming a laser cavity so that light amplified within the laser cavity passes through the at least one portion of the region that includes germanium.

8. The method of claim 1, wherein the method forms a plurality of portions of the layer that includes germanium having biaxial tensile strain.

9. The method of claim 8, wherein biaxial tensile strain within the plurality of portions of the layer that includes germanium is sufficient in at least parts of the plurality of portions to provide a direct bandgap.

10. The method of claim 9, further comprising forming a laser cavity so that light amplified within the laser cavity passes through more than one of the plurality of portions of the layer that includes germanium.

11. The method of claim 1, wherein tensile strain within the at least one portion of the layer that includes germanium is sufficient in at least a part of the at least one portion to provide a direct bandgap.

12. The method of claim 11, further comprising forming a laser cavity so that light amplified within the laser cavity passes through the at least one portion of the layer that includes germanium.

13. A method of communicating data, comprising coupling an electrical signal into an optical device comprising a first strained semiconductor portion of a semiconductor substrate to generate a responsive optical signal, transmitting the responsive optical signal through a waveguide comprising a first unstrained semiconductor portion of the semiconductor substrate and coupling the responsive optical signal into a detector comprising a second strained semiconductor portion of the semiconductor substrate, wherein the first strained semiconductor portion, the first unstrained semiconductor portion, and the second strained semiconductor portion are each formed in a common layer of the semiconductor substrate that includes germanium.

14. The method of claim 13, wherein the first strained semiconductor portion and second strained semiconductor portion are in-plane biaxially strained portions of the common layer of semiconductor substrate that includes germanium in contact with silicon germanium stressor regions.

15. The method of claim 13, wherein the common layer of the semiconductor substrate that includes germanium in which the first strained semiconductor portion of the semiconductor substrate, the first unstrained semiconductor portion of the semiconductor substrate, and the second strained semiconductor portion of the semiconductor substrate are formed is separated from another part of the semiconductor substrate by an insulating layer and the semiconductor substrate is a wafer.

16. The method of claim 15, wherein the optical device comprises a plurality of portions of the common layer of the semiconductor substrate that includes germanium formed by a pattern of embedded silicon germanium regions and the electrical signal is coupled into the plurality of portions.

17. The method of claim 15, wherein the detector comprises a plurality of portions of the common layer of the semiconductor substrate that includes germanium formed by a pattern of embedded silicon germanium regions and the responsive optical signal is coupled into the plurality of portions.

18. The method of claim 13, wherein the optical device comprises a plurality of portions of the common layer of the semiconductor substrate that includes germanium formed by a pattern of embedded silicon germanium regions and the electrical signal is coupled into the plurality of portions.

19. The method of claim 13, wherein the detector comprises a plurality of portions of the common layer of the semiconductor substrate that includes germanium formed by a pattern of embedded silicon germanium regions and the responsive optical signal is coupled into the plurality of portions.

20. The method of claim 13, wherein the optical device, the waveguide, and the detector are self-aligned to one another in the common layer of the semiconductor substrate that includes germanium.

21. The method of claim 15, wherein the optical device, the waveguide, and the detector are self-aligned to one another in the common layer of the semiconductor substrate that includes germanium.

* * * * *